United States Patent [19]

Cochran et al.

[11] 4,140,975
[45] Feb. 20, 1979

[54] HIGHLY SELECTIVE PROGRAMMABLE FILTER MODULE

[75] Inventors: Michael J. Cochran, Richardson; Edward R. Caudel, Dallas, both of Tex.

[73] Assignee: Texas Instruments Incorporated, Dallas, Tex.

[21] Appl. No.: 791,256

[22] Filed: Apr. 27, 1977

[51] Int. Cl.² .............................................. H04B 1/38
[52] U.S. Cl. ................................. 325/489; 333/70 T; 328/133; 325/25
[58] Field of Search ................... 325/15, 25, 20, 21, 325/452, 458, 468, 489; 328/167, 133, 134; 333/70 T; 329/124

[56] References Cited

U.S. PATENT DOCUMENTS

| | | | |
|---|---|---|---|
| 3,809,923 | 5/1974 | Esser | 328/167 |
| 3,953,745 | 4/1976 | Bailey | 328/167 |
| 3,978,416 | 8/1976 | Sutphin | 328/167 |
| 3,983,484 | 9/1976 | Hodama | 325/25 |
| 3,997,973 | 12/1976 | Buss | 333/70 T |

OTHER PUBLICATIONS

The Design and Operation of Practical Charge-Transfer Transversal Filters. IEEE Transaction vol. Ed-23, #2, Feb. 1976, pp. 133-141.
Programmable Transversal Filtering Using the Surface-Acoustic-Wave Diode Convolver, Grant et al., Wave Electronics 1 (1974/1976), pp. 381-386.

*Primary Examiner*—Robert L. Griffin
*Assistant Examiner*—Michael A. Masinick
*Attorney, Agent, or Firm*—Stephen S. Sadacca; James T. Comfort; Melvin Sharp

[57] ABSTRACT

A programmable filter module includes a charge transfer device bandpass filter and a phase locked loop. The bandpass filter has a plurality of passbands dependent upon the frequency of a clocking signal. The phase locked loop receives a reference signal of one frequency and in response thereto, generates the clocking signals in the form N1 divided by N2 times the frequency of the reference signal, where N1 and N2 are programmable integers.

8 Claims, 37 Drawing Figures

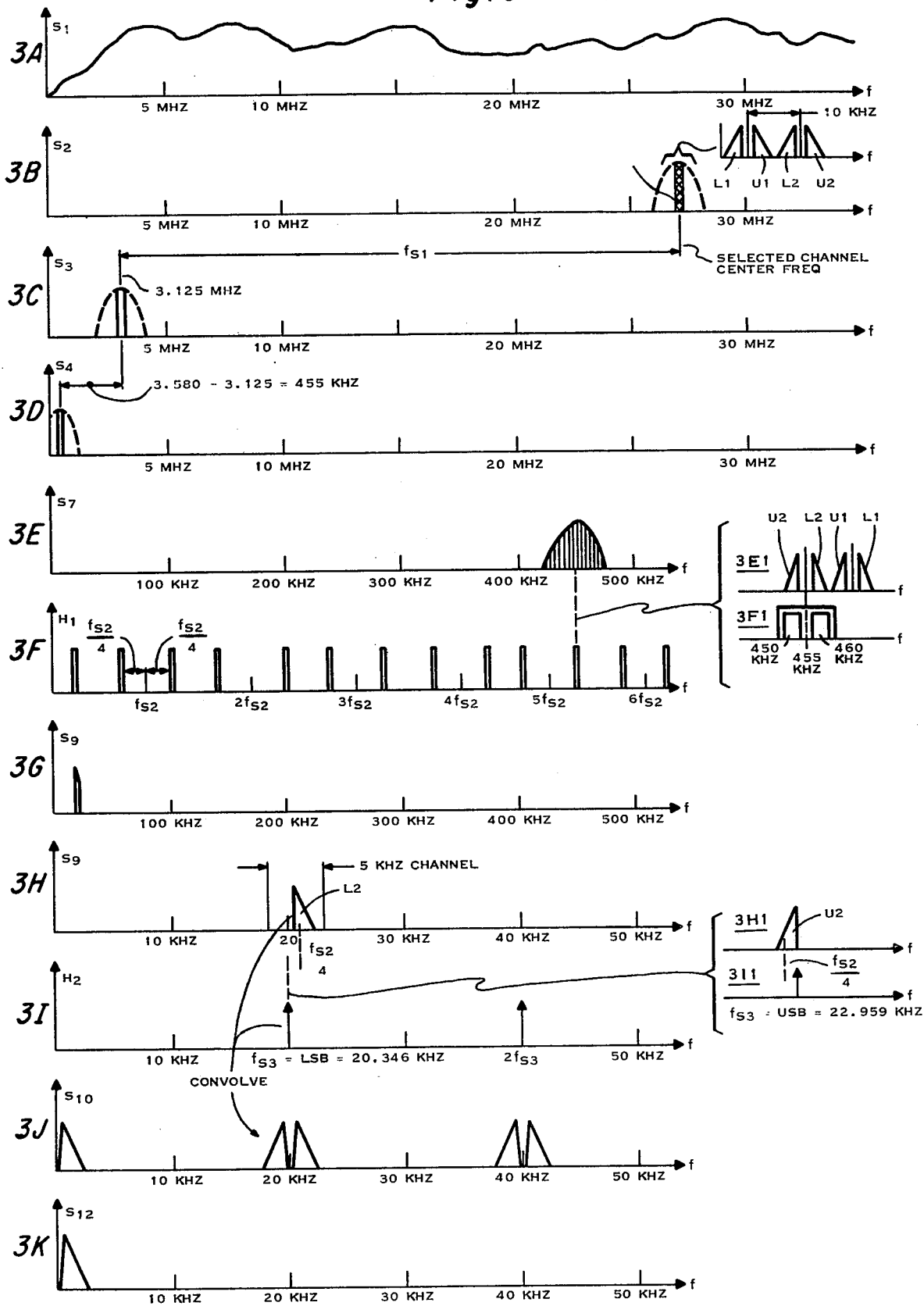

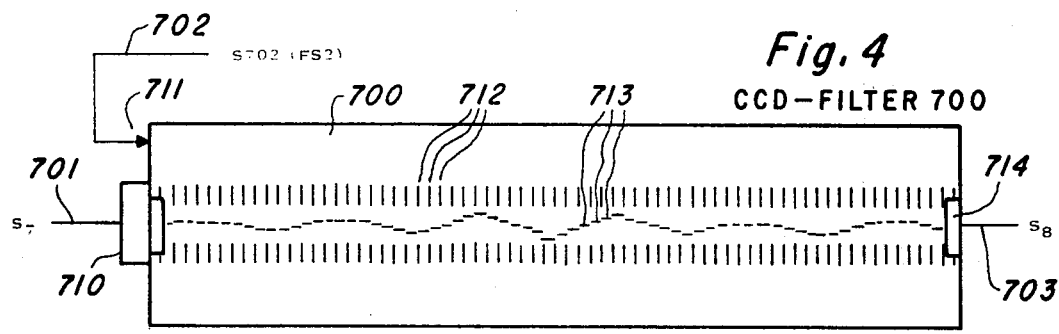
Fig. 4 CCD-FILTER 700
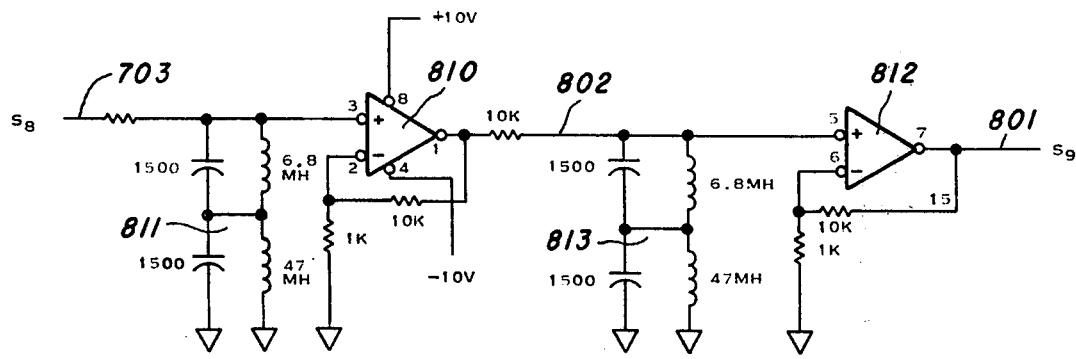
Fig. 4I AMPLIFIER 800

CLOCKING MODULE 3000

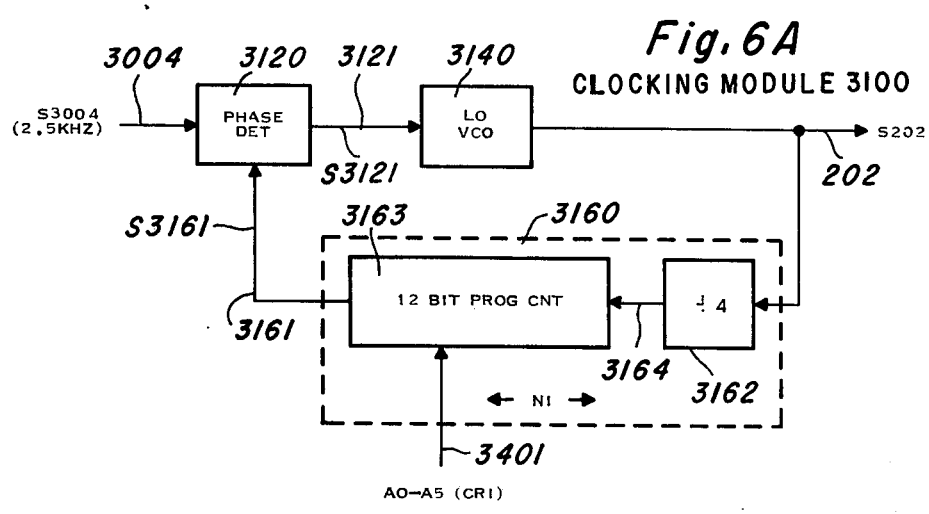
*Fig. 6A*
CLOCKING MODULE 3100
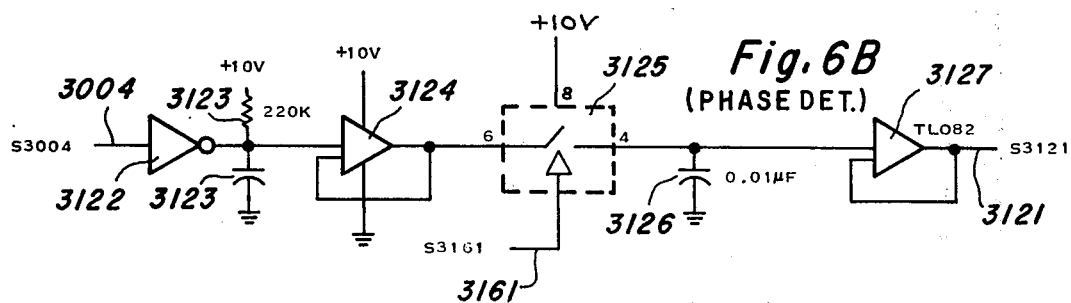
*Fig. 6B* (PHASE DET.)
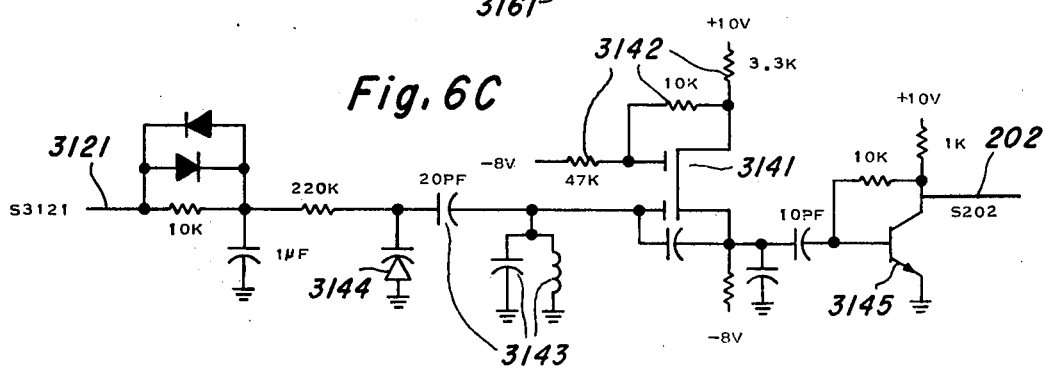
*Fig. 6C*

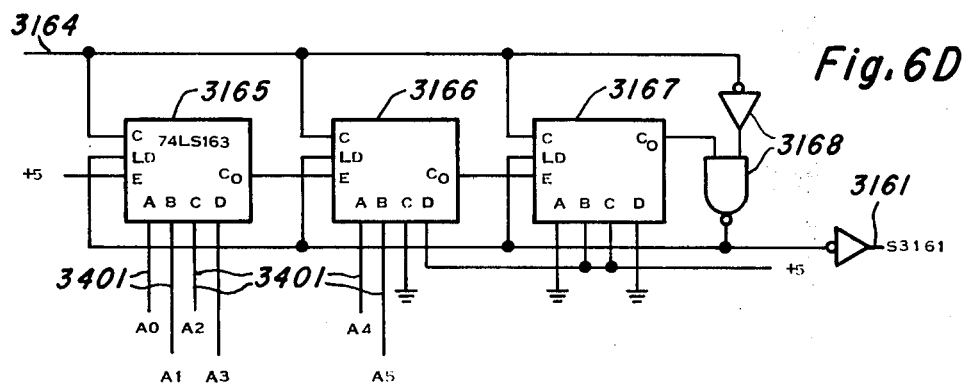
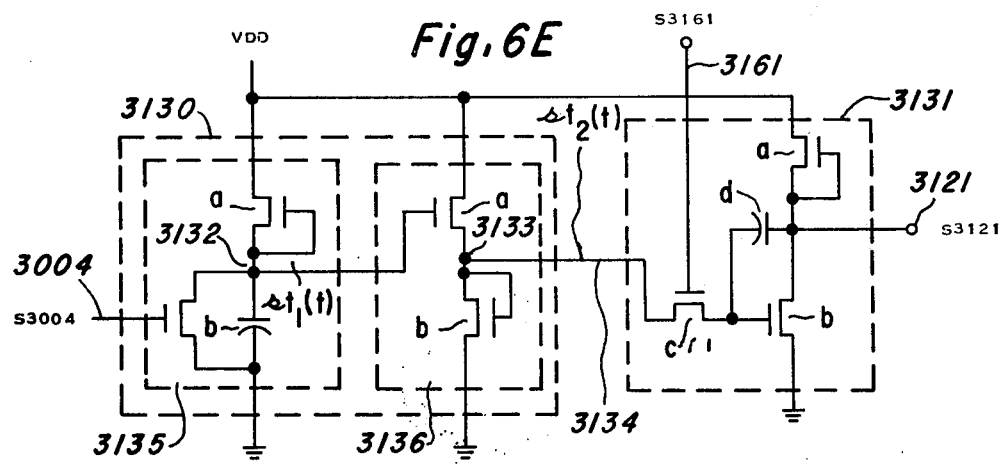
Fig. 6F
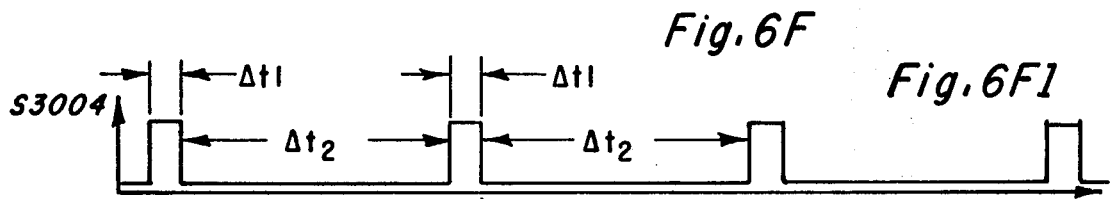
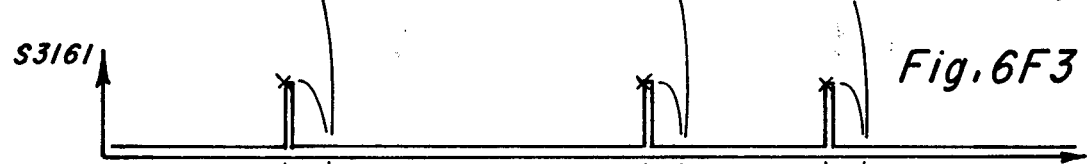
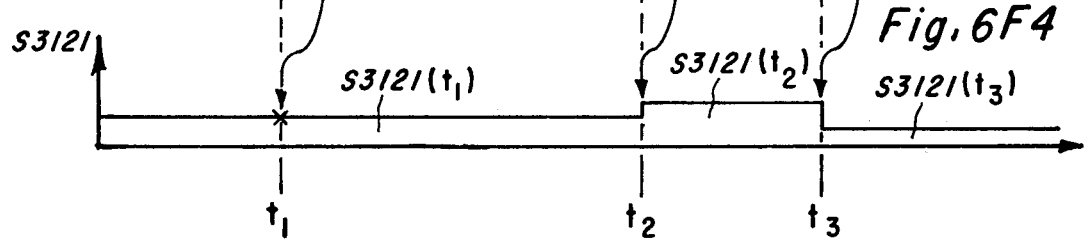

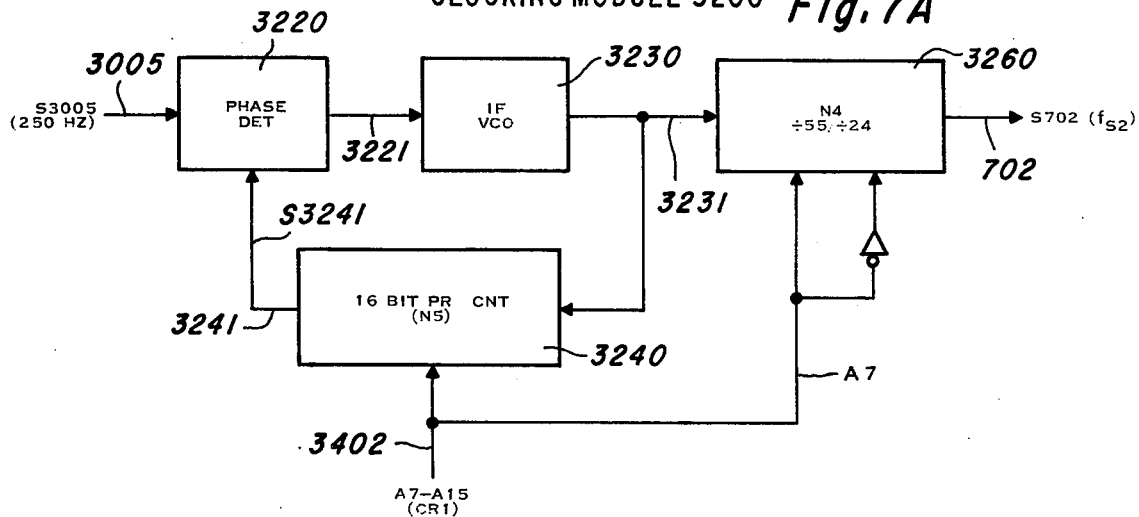
Fig. 7A
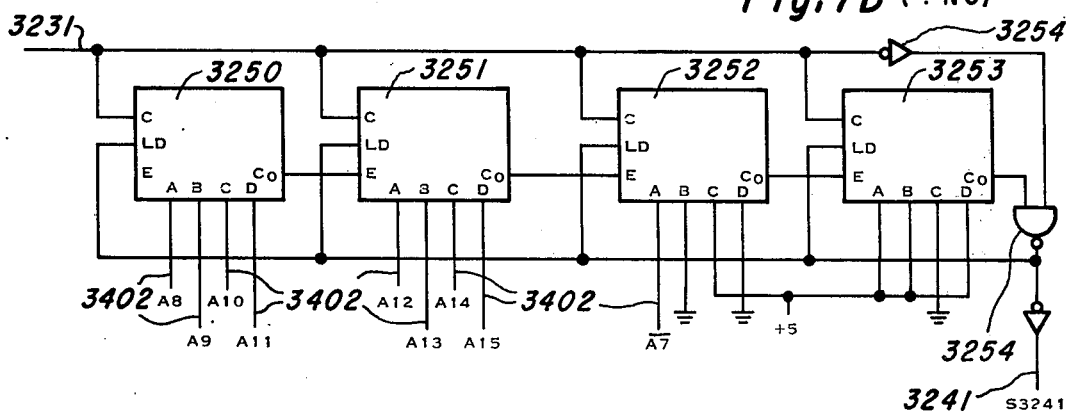
Fig. 7B (÷N5)
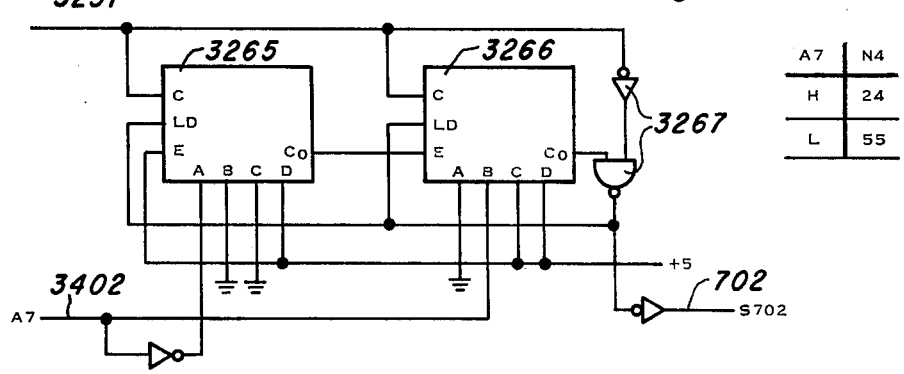
Fig. 7C (÷N4)

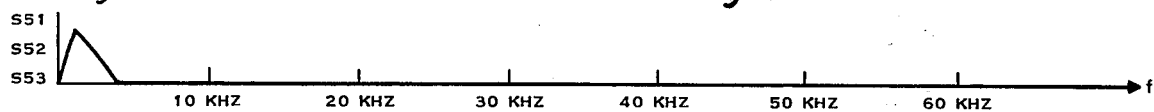
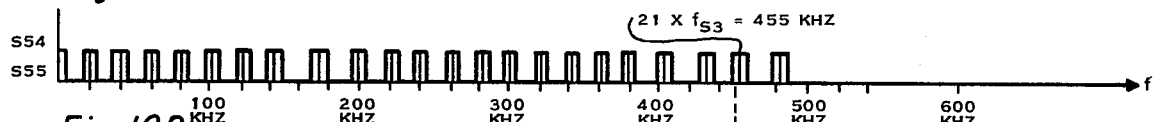
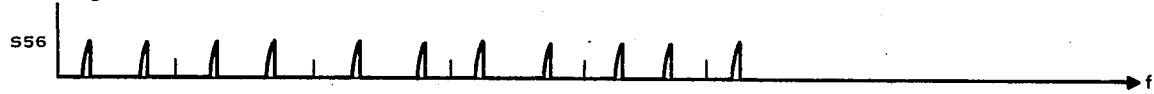
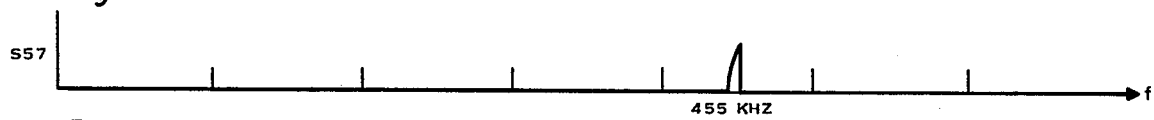
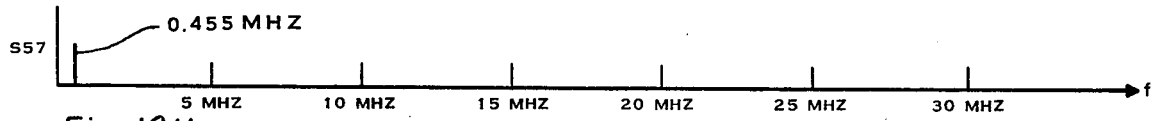
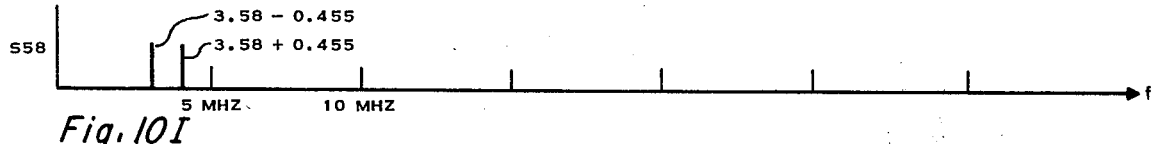
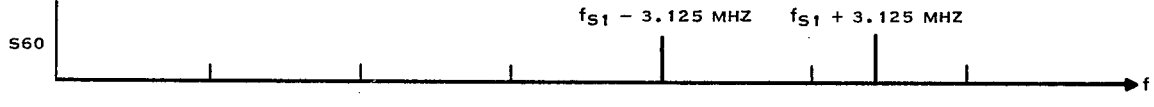
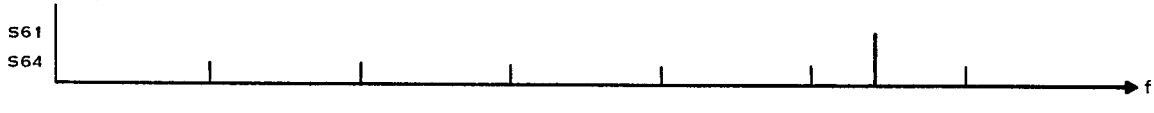

HIGHLY SELECTIVE PROGRAMMABLE FILTER MODULE

BACKGROUND OF THE INVENTION

This invention relates to analog signal processing devices, and more particularly, to electronic filtering and mixing devices. This invention further relates to the transceiver and components thereof described and claimed in the following U.S. Patent Applications filed of even date with and assigned to the assignee of the present invention: U.S. Ser. No. 791,611 entitled "A Digitally Transmitting Transceiver" by Edward R. Caudel and William R. Wilson; U.S. Ser. No. 791,629 entitled "A Clarifying Radio Receiver" by Michael J. Cochran and Edward R. Caudel; U.S. Ser. No. 791,449 entitled "An Automatically Clarifying Radio Receiver" by Michael J. Cochran and Edward R. Caudel; U.S. Ser. No. 791,254 entitled "A Computer Controlled Radio System" by Michael J. Cochran and Edward R. Caudel; U.S. Ser. No. 791,450 entitled "A Transceiver With Only One Reference Frequency" by Michael J. Cochran; U.S. Ser. No. 791,264 entitled "An Electronic Phase Locked Loop" by Michael J. Cochran; U.S. Ser. No. 791,265 entitled "A Signal Strength Measuring Transceiver" by Edward R. Caudel; U.S. Ser. No. 791,614 entitled "A Charge Transfer Device Radio System" by Michael J. Cochran; U.S. Ser. No. 791,253 entitled "A Transceiver Capable of Sensing A Clear Channel" by Jerry D. Merryman, Michael J. Cochran and Edward R. Caudel; U.S. Ser. No. 791,256 entitled "A Highly Selective Programmable Filter Module" by Michael J. Cochran and Edward R. Caudel; and U.S. Ser. No. 791,616 entitled "A Dual Processor Transceiver" by Edward R. Caudel, William R. Wilson and Thomas E. Merrow. Such copending patent applications are hereby incorporated herein by reference. Filtering devices receive electronic input signals comprised of a plurality of non-overlapping frequency bands, and filter a selected band from the plurality. Mixing devices receive frequency signals of one frequency spectrum, and generate output signals having a frequency spectrum proportional to the input signals, but shifted in frequency.

The invention herein described is called a highly selective programmable filter module because it has passbands whose width and center frequency are adjustable in very small increments. Applications for this type of filtering capability are very broad. Typical uses include the processing of signals in radio systems, television receivers, and CB transceivers. As an example of an application for the variable bandwidth feature, some radio receivers demodulate both amplitude modulated signals (AM) and single sideband signals (SSB). The bandwidth of an AM signal is approximately twice the bandwidth of an SSB signal. Therefore, during one time interval, such receivers require a filter having a bandwidth of an AM signal; and alternatively, during another time interval, require a filter having a bandwidth of an SSB signal. The invention herein described has a bandwidth which is selectively adjustable to the width of an AM signal or an SSB signal.

In the above example, the passband width of the invention would be varied by a factor of approximately 2:1. Alternatively, the invention herein described provides passbands with widths which are selectable in much smaller increments. As an example, the width of a 10-kHz bandpass may be increased or decreased in increments of only 5 Hz.

As mentioned above, the invention herein described also has passbands whose center frequency is adjustable in very small frequency increments. This capability may be utilized in a CB transceiver, for example, to filter one band of signals from a plurality of non-overlapping frequency bands. In this application, the center frequency of the filter's passband is adjusted in increments equal to the spacing between adjacent channels. Typically, single sideband channels are separated by approximately 5 kHz; whereas, AM channels are separated by approximately 10 kHz. The invention herein described is capable of performing frequency band shifting for filtering both AM and SSB channels. Additionally, the invention herein described is capable of frequency shifting its center frequency in increments much smaller than adjacent channel spacing. For example, a passband of approximately 5-kHz width may be shifted in increments of 10 Hz by the invention herein described.

In addition to performing a filtering operation, the present invention performs a mixing operation; and, the frequency at which the signals are mixed is also adjustable by very small frequency increments. This capability, in combination with the capability to vary the center frequency of a passband by small increments, may be utilized to perform a clarifying function, as an example. The clarifying function is performed on single sideband signals. Such signals are difficult to demodulate because a sideband may lie anywhere within its assigned frequency channel. As a result, audible tones which are produced by demodulating a sideband channel have either higher frequency components or lower frequency components than should be present dependent upon whether the sideband lies in the upper portion or the lower portion of its assigned channel, respectively. The present invention may be utilized to clarify the resulting audible sound by adjusting the center frequency of its passband to be precisely aligned with the sideband signals regardless of where they lie within a channel. As a result of this precise alignment, the single sideband will be filtered and mixed by a frequency which will compensate for any misalignment of the sideband in the channel.

The above application of the invention are herein given only as examples. The invention has a multitude of applications. and can be applied wherever the bandwidth of a filter is required to be highly selectable, the center frequency of a filter is required to be highly adjustable, or a mixing device is required for shifting an input signal by a highly selectable frequency.

Accordingly, it is one object of the invention to provide an improved electronic filtering device.

It is another object of the invention to provide a filter having passbands with a highly selectable bandwidth.

Another object of the invention is to provide a filter having passbands with a center frequency which are adjustable by fine increments.

Another object of the invention is to provide a mixing device for frequency shifting an input signal by a finely adjustable frequency.

Still another object of the invention is to provide a filter module having passbands and a center frequency which are proportional to a variable reference frequency times the term (N1/N2) N1 and N2 are arbitrary integers.

SUMMARY OF THE INVENTION

These and other objects are accomplished in accordance with the invention by a filter module comprised of a phase locked loop and a charge transfer device bandpass filter. The bandpass filter has a clocking input coupled to receive clocking signals of a selectable frequency $f_S$. The filter has passbands centered at frequencies $N \times f_S \pm Kf_O$. The phase locked loop has an input coupled to receive a reference clock signal of a variable frequency $f_R$. In response thereto, the phase locked loop generates a clocking frequency of the form $f_R \times N1$. This signal is received by a divide-by N2 counter. The output of the counter couples to the clocking input of the transversal filter. N1 and N2 are arbitrary integers.

DESCRIPTION OF THE DRAWINGS

The essential features believed to be characteristic of the invention are set forth in the appended claims; the invention itself, however, as well as other features and advantages thereof, may best be understood by referring to the following detailed description of the preferred embodiments when read in conjunction with the accompanying drawings; wherein:

FIGS. 3A-3K are a set of frequency diagrams illustrating signals in the frequency domain which are present at various points on the receive signal path of FIG. 2.

FIG. 4 is a detailed circuit diagram of CCD filter 700 in signal path of FIG. 2.

FIGS. 6A-6F are detailed circuit diagrams of a clocking module 3100 included within FIG. 2.

FIGS. 7A-7C are detailed logic diagrams of a clocking module 3200 included within FIG. 2.

FIGS. 10A-10K are a series of frequency diagrams illustrating signals at various points on the transmit signal path of FIG. 9.

DETAILED DESCRIPTION OF SPECIFIC EMBODIMENTS

Figure 1:
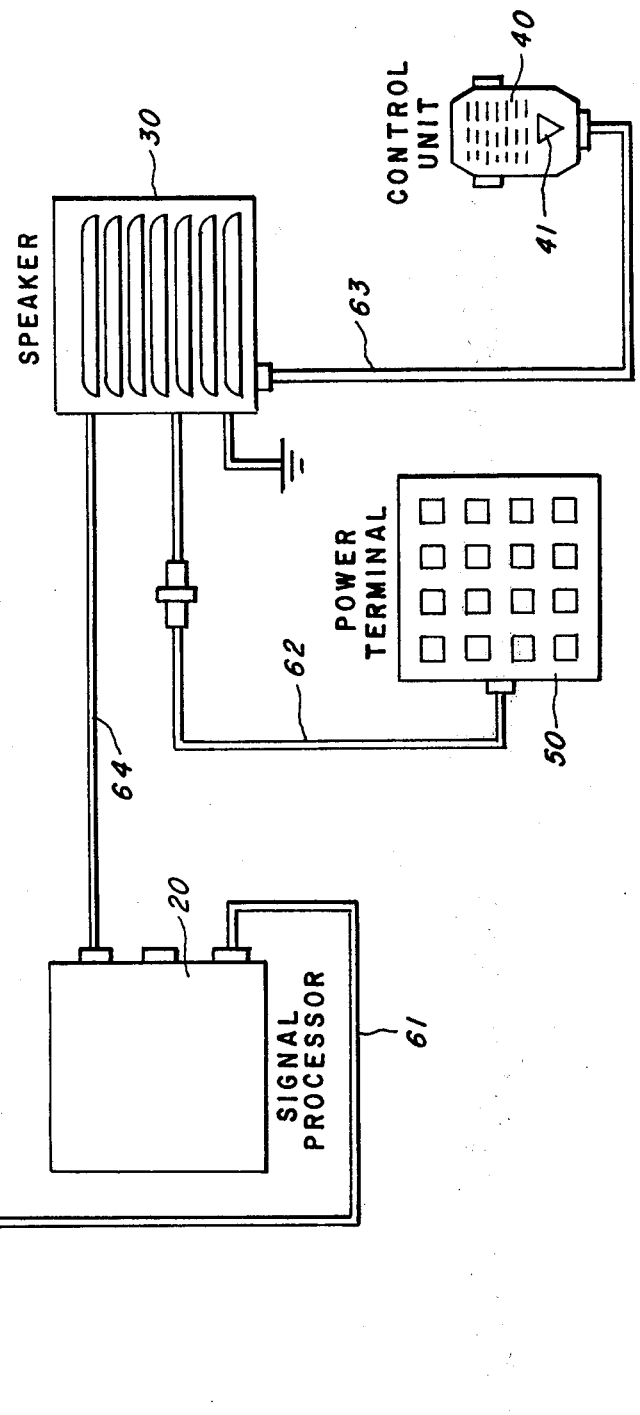
FIG. 1 is a block diagram illustrating the major components of a transceiver constructed according to the invention.

Referring now to FIG. 1, a block diagram illustrating the major components of a transceiver which is constructed according to the invention is illustrated. The transceiver is comprised of an antenna 10, a signal processing unit 20, a speaker 30, a control unit 40, and a power terminal 50. These components are electrically intercoupled by conductive cables 61-64 as illustrated in FIG. 1.

The transceiver of FIG. 1 has a transmit mode of operation and a receive mode of operation. Basically, in the transmit mode the operator speaks into a microphone 41 contained in control unit 40, and the audio signals are therein converted to electrical signals which are sent to analog signal processor 20 over cables 63 and 64. Signal processor 20 frequency shifts the received signal from an audio frequency to a frequency band of a selectable high frequency channel. The selected channel may be either a single sideband channel of approximately 5-kHz bandwidth, or an amplitude modulated channel of approximately 10 kHz. In either case the frequency shifted signals are sent via cable 61 to antenna 10 and therein transmitted via radiation.

In the receive mode, antenna 10 receives radiated electrical signals comprised of a plurality of frequency bands lying respectively within a plurality of non-overlapping frequency channels. The plurality of frequency bands are sent to signal processor 20 via cable 61. Signal processor 20 filters a selectable band from the plurality of bands, and down shifts in frequency the selected band to an audible frequency range. The selected down shifted frequency band is sent to speaker 30 via cable 64 where it is therein converted to audible sounds.

Figure 2:
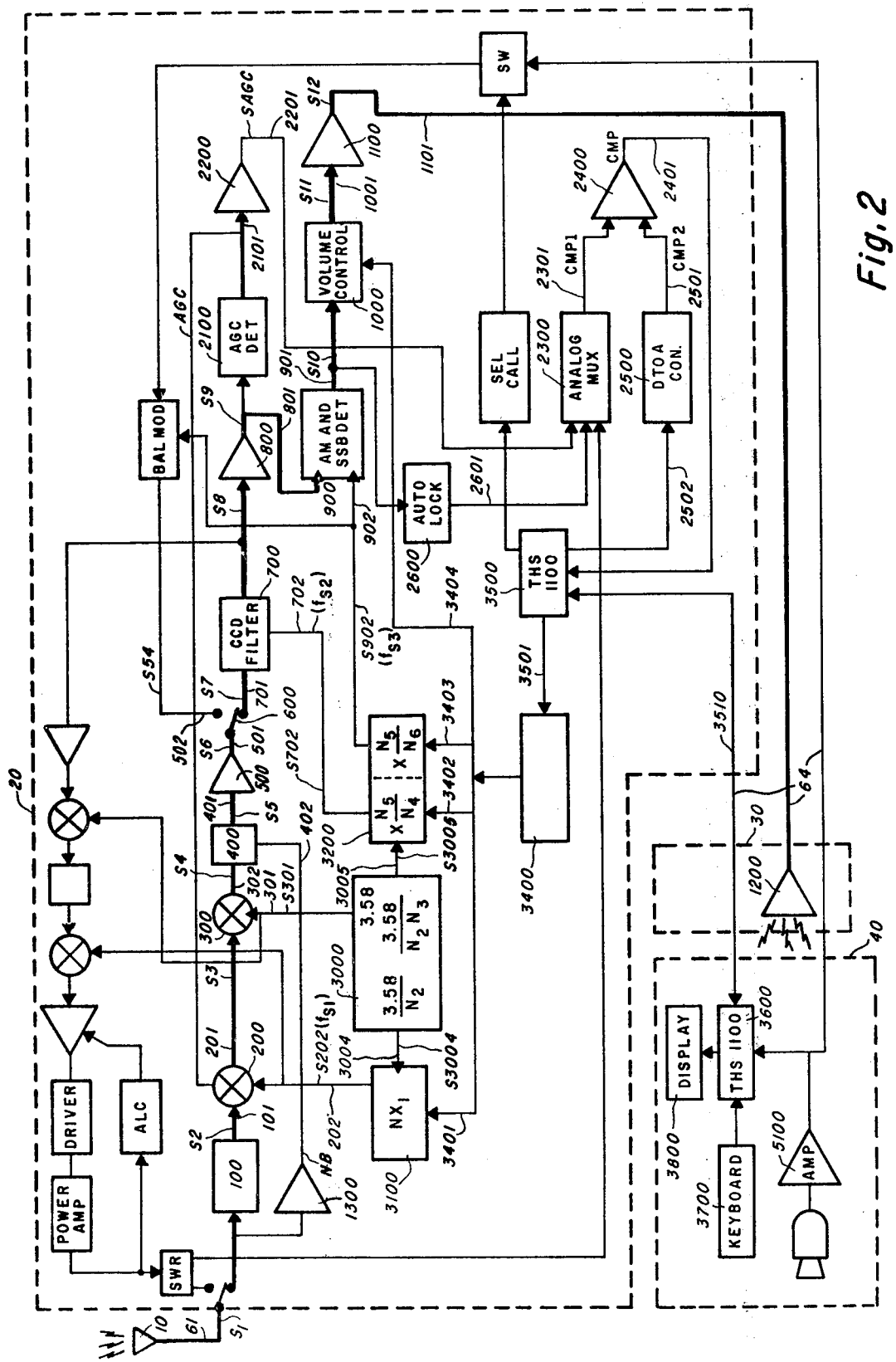
FIG. 2 is a more detailed block diagram of the transceiver of FIG. 1 wherein the receive signal path components are emphasized.

The manner in which the transceiver of FIG. 1 performs the above described receive operation is best understood by referring to FIG. 2 and FIG. 3. FIG. 2 is a circuit diagram of the transceiver of FIG. 1. The circuit includes a signal path which is operable in the receive mode and which is emphasized in FIG. 2 by a thickened line. Signals S1-S12 are present at various points (as illustrated in FIG. 2) on this signal path. FIG. 3 is a set of frequency diagrams illustrating some of the signals S1-S12 in the frequency domain.

Antenna 10 is the first element of the receive signal path. Cable 61 couples to the output of antenna 10 and signal S1 as illustrated in FIG. 3a is generated thereon. Basically, signal S1 is unfiltered and thus is comprised of frequency components which cover the electromagnetic spectrum. Lead 61 couples to filter 100. Filter 100 has an output lead 101 and signals S2 are generated thereon. As illustrated in FIG. 3b, signal S2 has a frequency range of approximately 26MHz to 28MHz. The skirt response of filter 100 is not critical as its only function is to pass the band of frequencies lying between 26.965MHz and 27.405MHz. This range of frequencies includes 40 amplitude modulated (AM) channels as presently assigned by the FCC. Table I lists the center frequency of each of the 40 channels. Each AM channel is divided into a lower sideband channel and an upper sideband channel. FIG. 3b illustrates the 26.96MHz-27.405MHz frequency range by the cross hatched areas S2a. FIG. 3B1 is a blow up of area S2a and single sideband channels L1, U1, L2, U2, lying within the first two AM channels are illustrated therein.

TABLE I

| CH | CENTER FREQUENCY | CH | CENTER FREQUENCY |
|---|---|---|---|
| 1 | 26.965 | 20 | 27.205 |
| 2 | 26.975 | 21 | 27.215 |
| 3 | 26.985 | 22 | 27.225 |
| X | 26.995 | 24 | 27.235 |
| 4 | 27.005 | 25 | 27.245 |
| 5 | 27.015 | 23 | 27.255 |
| 6 | 27.025 | 26 | 27.265 |
| 7 | 27.035 | 27 | 27.275 |
| X | 27.045 | 28 | 27.285 |
| 8 | 27.055 | 29 | 27.295 |
| 9 | 27.065 | 30 | 27.305 |
| 10 | 27.075 | 31 | 27.315 |
| 11 | 27.085 | 32 | 27.325 |
| X | 27.095 | 33 | 27.335 |
| 12 | 27.105 | 34 | 37.345 |
| 13 | 27.115 | 35 | 27.355 |
| 14 | 27.125 | 36 | 27.365 |
| 15 | 27.135 | 37 | 27.375 |
| X | 27.145 | 38 | 27.385 |
| 16 | 27.155 | 39 | 27.395 |

TABLE I-continued

| CH | CENTER FREQUENCY | CH | CENTER FREQUENCY |
|---|---|---|---|
| 17 | 27.165 | 40 | 27.405 |
| 18 | 27.175 | | |
| 19 | 27.135 | | |
| X | 27.195 | | |

TABLE II

| CH | $f_{s1}$ | CH | $f_{s1}$ |
|---|---|---|---|
| 1 | 23.840 | 20 | 24.080 |
| 2 | 23.850 | 21 | 24.090 |
| 3 | 23.860 | 22 | 24.100 |
| X | 23.870 | 24 | 24.110 |
| 4 | 23.880 | 25 | 24.120 |
| 5 | 23.890 | 23 | 24.130 |
| 6 | 23.900 | 26 | 24.140 |
| 7 | 23.910 | 27 | 24.150 |
| X | 21.910 | 28 | 24.160 |
| 8 | 23.930 | 29 | 24.170 |
| 9 | 23.940 | 30 | 24.180 |
| 10 | 23.950 | 31 | 24.190 |
| 11 | 23.960 | 32 | 24.200 |
| X | 23.970 | 33 | 24.210 |
| 12 | 23.980 | 34 | 24.220 |
| 13 | 23.990 | 35 | 24.230 |
| 14 | 24.000 | 36 | 24.240 |
| 15 | 24.010 | 37 | 24.250 |
| X | 24.020 | 38 | 24.260 |
| 16 | 24.030 | 39 | 24.270 |
| 17 | 24.040 | 40 | 24.280 |
| 18 | 24.050 | | |
| 10 | 24.060 | | |
| X | 24.070 | | |

Lead 101 couples to the signal input of a mixer 200 which has an output lead 201 and signals S3 are generated thereon. Mixer 200 also has an input lead 202 for receiving clock signals of the first selectable frequency $f_{s1}$. The frequency $f_{s1}$ is chosen to equal the difference between the center frequency of the selected AM channel and the quantity 3.125 mHz. Mixer 200 generates signal S3 by mixing signal S2 with frequency $f_{s1}$, and thus the selected AM channel is centered at the frequency 3.125 MHz. This fact is illustrated in FIG. 3c. TABLE II lists the value of frequency $f_{s1}$ along side of the number of the selected AM channel.

Lead 201 couples to a second mixer 300. Mixer 300 has a clock input lead 301 and an output lead 302. A clocking signal of 3.58 MHz is applied to lead 301. Mixer 300 mixes signals S3 with the signal on lead 301 and, in response thereto, generates signals S4 on lead 302. As a result of the mixing operation, the selected AM channel in S4 is centered at frequency 455 kHz. FIG. 3d illustrates signal S4.

Signal S4 passes through a noise blanker 400, and noise blanker 400 is serially coupled to an amplifier 500. Signals S5 and S6 are generated by noise blanker 400 and amplifier 500, respectively. In general, the function of noise blanker 400 and amplifier 500 is to filter and amplify signal S4, but not to frequency shift signal S4. Thus, the center frequency of the selected channel is present in signal S6 at 455 kHz. Signal S6 is illustrated in the frequency domain in FIG. 3e.

In the receive mode, a switch 600 couples signals S6 to the input of a charge transfer device filter 700 via a lead 701. Charge transfer device filter 700 also has a clocking lead 702 for receiving clocking signals of a second selectable frequency $f_{s2}$. In response to the frequency $f_{s2}$, filter 700 generates output signals S8 on a lead 703.

In the preferred embodiment, charge transfer device filter 700 is a charge coupled device (CCD) transversal filter having a plurality of passbands which are programmable by varying the selectable frequency $f_{s2}$.

Copending application, Ser. No. 758,366, entitled, "Frequency Converting Filter," by Jerry Norris and Clinton Hartmann, filed January, 1977, assigned to the same assignee of this application, contains a detailed description of its construction. Basically, the charge coupled device transversal filter is comprised of a plurality of serially connected stages having a split electrode structure defining an impulse response of the form (sine N/N) (cosine $2\pi f_0 N$). In this expression, the frequency $f_0$ equals $1/(N_0 \times t_s)$ where the quantity $1/t_s$ equals the selectable frequency $f_{s2}$, and $N_0$ is the number of stages over which the term cosine ($2\pi f_0 t$) completes one cycle. The bandwidth $\Delta f$ of each of the passbands equals $1/(t_s N_1)$ where the quantity $1/t_s$ again equals the selectable sampling frequency $f_{s2}$, and $N_1$ equals the number of stages in which the term (sine N)/N passes before reaching its first zero crossing. Copending application, Ser. No. 758,365, entitled, "Programmable Frequency Converting Filter," by Lawrence Reagan, filed Jan. 5, 1977, assigned to the same assignee of this application, describes how the passbands of a charge transfer device transversal filter are programmed in response to a clocking frequency.

In one preferred embodiment, the parameters $N_0$ and $N_1$ are chosen such that the passbands of filter 700 have a center frequency of $N \times f_{s2} \times 1/4f_{s2}$, and the bandwidth of filter 700 equals $1/20f_{s2}$. FIG. 3f illustrates the frequency response of the charge coupled device filter having the above described characteristics. The function of the filter 700 is to receive signals S7 on lead 701, to filter a selected one of the channels (either AM or sideband) from the plurality of channels comprising signal S7, and to frequency shift the selected channel down in frequency.

If the selected channel is a single sideband channel, the channel has a width of approximately 5 kHz and thus filter 700 is clocked with a frequency $f_{s2}$ such that its passbands are approximately 5 kHz wide. In other words, the quantity $1/20 f_{s2}$ approximately equals 5 kHz when the selected channel is a single sideband channel. Additionally, the frequency $f_{s2}$ is chosen such that one of the multiple passbands of filter 700 aligns with the sideband channel to be selected from S7. In the preferred embodiment, the passband of filter 700 that is centered at $5f_{s2} + 1/4f_{s2}$ is aligned with the sideband channel selected from signal S7. This is filter 700's eleventh passband. As illustrated in Table IIIa, a frequency $f_{s2}$ equal to 86,409 Hz aligns the center of the eleventh passband of filter 700 with frequency 450 kHz. And a clocking frequency $f_{s2}$ of 86,932 Hz aligns the center of the eleventh passband of filter 700 at 460 kHz. The width of both of these passbands is approximately 5 kHz. FIG. 3E1 is a blow up of signal S7 about the frequency of 455 kHz, and FIG. 3F1 is a blow up of FIG. 3F about the same frequency. Together, these figures illustrate the alignment of the eleventh passband of filters 700 with the selected channel. It should also be noted, as illustrated in FIG. 3E1, that the mixing operation of mixer 300 results in the flip-flopping in frequency of the upper and lower sideband channels. This flip-flopping occurs because the mixing frequency of 3.58mHz is higher than the center frequency of the selected AM channel, i.e., 3.125mHz.

The clocking frequency $f_{s2}$ is also chosen such that filter 700 has bandwidths of approximately 10 kHz, one of which is centered about the frequency of 455 kHz. Such a characteristic is used to pass an AM signal centered about 455 kHz. Table IIIb illustrates that a clocking frequency $f_{s2}$ equal to 202,218 Hz causes filter 700 to have its passband centered at 455 kHz and a bandwidth of approximately 10 kHz. This situation is also illustrated in FIGS. 3E1 and 3F1.

TABLE IIIa

| $\frac{1}{20} f_{s2}$ | $5f_{s2} + \frac{1}{4} f_{s2}$ | $f_{s2}$ |
|---|---|---|
| 5 kHz | 450 kHz | 86,409 Hz |
| 5 kHz | 460 kHz | 86,932 Hz |

TABLE IIIb

| $\frac{1}{20} f_{s2}$ | $2f_{s2} + \frac{1}{4} f_{s2}$ | $f_{s2}$ |
|---|---|---|
| 10 kHz | 455 kHz | 202,218 Hz |

Lead 703 couples the output of CCD filter 700 to an amplifier 800. Amplifier 800 is tuned to pass only those frequencies lying within the first passband of CCD filter 700. That is, amplifier 800 only passes frequencies lying about 1/4 $f_{s2}$. Amplifier 800 has an output lead 801 and signals S9 are generated thereon. FIG. 3G illustrates signal S9 on the same frequency scale as FIG. 3F (which illustrates the passbands of filter 700); and FIG. 3H illustrates signal S9 on an expanded frequency scale so that its characteristics are more apparent. In FIG. 3H, the signal S9 is illustrated as lower sideband channel L2 as an example.

Signal S9 is coupled to a demodulator 900 via the lead 801. Demodulator 900 functions to shift signals S9 in frequency to the audio range. When sideband signals are received, this shift in frequency is accomplished by time sampling signal S9 at a third selectable $f_{s3}$. Time sampling equals convolution in the frequency domain. FIG. 3I illustrates the frequency components of a sampling transfer function H2 which samples at a frequency $f_{s3}$ and FIG. 3J illustrates the convolution of signal S9 with transfer function H2. This convolution signal is labeled S10 and is generated on a lead 901.

In order to properly shift signal S9 to the audio frequency range by the convolution operation, it is necessary that the frequency $f_{s3}$ be carefully aligned frequencies of S9. When signal S9 is a lower sideband, frequency $f_{s3}$ is chosen to align with the lowest frequency present. Thus, in FIG. 3H, frequency $f_{s3}$ lies to the left of the quantity $f_{s2}/4$, and nominally is 20.346 kHz.

One difficulty in receiving single sideband signals is that they have no carrier to lock onto. Thus, the exact position in frequency of the signal S9 is unknown. All that is known is that the signal lies somewhere within its assigned 5kHz channel; and therefore a problem exists in being able to align frequency $f_{s3}$ with signal S9 regardless of where the latter lies within its channel. The tone quality of the resulting audible signal is directly related to how well frequency $f_{s3}$ and signal S9 are aligned. Elements 3200-3500 provide a means for incrementally adjusting frequency $f_{s3}$ so as to be properly aligned with signal S9 regardless of where it lies within its 5-kHz channel.

As described above, amplitude modulated signals may also be received. In that case, frequency $f_{s2}$ equals 202,218; and therefore signal S9 which is centered at $f_{s2}/4$ has a center frequency of 50.555 kHz. Demodulator 900 shifts this signal to the audio range by a standard diode envelope detector which does not require a third sampling frequency.

Signal S10 couples via lead 901 to volume control unit 1000. Volume control unit 1000 has an output lead 1001 and signals S11 are generated thereon. Lead 1001 couples to an audio amplifier 1100 which has an output lead 1101 and signals S12 are generated thereon. Lead 1101 is coupled to a speaker 30 where the signals S12 shown in FIG. 3 are converted to audible sound.

As previously described, switch 600 has signal inputs coupled to leads 501 and 502, and an output coupled to lead 701. A logic signal determines whether lead 501 or 502 is coupled to lead 701 dependent upon whether the transceiver is in a receive mode or a transmit mode, respectively.

FIG. 4 is a greatly enlarged top view of CCD transversal filter 700. Lead 701 couples to an input stage 710 of filter 700. Lead 702, carrying clocking signals of the second selectable frequency $f_{s2}$, couples to the clocking input 711 of filter 700. As previously described, filter 700 is comprised of a plurality of serially-connected stages 712; and each of the stages has a split electrode. These splits 713 have a profile of the form (sine N/N) (cosine $2\pi f_0 N$). This structure has a plurality of passbands centered about multiples of the frequency $f_{s2}$ as previously described. Lead 703 couples to an output stage 714 of filter 700, and the signals S8 are generated thereon.

As the preceding description indicates, the operation of the transceiver of FIG. 2 is dependent upon the proper generation of three selectable frequencies $f_{s1}$, $f_{s2}$, and $f_{s3}$. The clocking means for generating these frequencies will now be described. FIG. 2 illustrates these clocking means in block diagram form. They are comprised of clocking modules 3000, 3100, and 3200. Basically, module 3000 generates signal S301 which is comprised of a fixed frequency of 3.58 mHz. Module 3000 also generates signals S3004 and S3005 on leads 3004 and 3005, respectively. Lead 3004 couples to module 3100, which in response to S3004 generates signals S202 comprised of frequency $f_{s1}$. Lead 3005 couples to module 3200 which receives signals S3005 and, in response thereto, generates signals S702 and S902 comprised of frequencies $f_{s2}$ and $f_{s3}$, respectively.

The selectable frequencies $f_{s1}$, $f_{s2}$, $f_{s3}$ are generated by modules 3000 and 3200 as multiples of 3.58 mHz. These multiples are designated as $N_1$-$N_6$ in FIG. 2. Some of the multiples are fixed, while other multiples are programmable. TABLE IV lists the selectable frequencies, $f_{s1}$, $f_{s2}$, $f_{s3}$ along with the multiples $N_1$-$N_6$ and the intermediate clocking signals S3004 and S3005 as a function of the particular single sideband channel or AM channel that is to be received.

TABLE IV

|  | SSB-CH |  |  |  | AM-CH |  |
|---|---|---|---|---|---|---|
|  | 1L | 1U | 2L | 2U | 1 | 2 |
| osc | 3.58MHZ | → | → | → | → | → |
| $f_{s1}$ | 23.84MHZ | 23.84MHZ | 23.85MHZ | 23.85MHZ | 23.84MHZ | 23.85MHZ |
| $N_2$ | 1432 | → | → | → | → | → |
| S3004 | 2.5KHZ | → | → | → | → | → |
| $N_1$ | 9,536 | → | 9,540 | → | 9,536 | 9,540 |
| $f_{s2}$ | 86,932HZ | 86,409HZ | 86,932HZ | 86,409HZ | 202,218HZ |  |

TABLE IV-continued

|  | SSB-CH | | | | AM-CH | |
|---|---|---|---|---|---|---|
|  | 1L | 1U | 2L | 2U | 1 | 2 |
| $N_3$ | 10 | → | → | → | → | → |
| $S3005$ | 250HZ | → | → | → | → | → |
| $N_4$ | 55 | → | → | → | 24 → | → |
| $N_5$ | 19,125 | 19,010 | 19,125 | 19,010 | 19,413 | 19,413 |
| $f_{s3}$ | 20,345HZ | 22,959HZ | 20,345HZ | 22,959HZ | H | H |
| $N_6$ | 235 | 207 | 235 | 207 | X | X |

Some of the information in TABLE Iv can be correlated with the preceding description. Compare, for example, the $f_{s1}$ frequency listings of TABLE II, with the entries in TABLE IV. Also compare the TABLE III entries of $f_{s2}$, with the TABLE IV entries of $f_{s2}$. And further compare the demodulating clocking frequency $f_{s3}$ of FIGS. 3I and 3I1 with the $f_{s3}$ entries in TABLE IV.

Given the values of $f_{s1}$, $f_{s2}$ and $f_{s3}$ as listed in TABL IV, $N_1$-$N_6$ must be chosen such that the desired frequencies are obtained. To this end, multiplier $N_2$ is chosen to be 1432. Thus, signal S3004 is a fixed frequency of 2.4 kHz. Accordingly, a selectable frequency $f_{s1}$ of 23.84 kHz is obtained by setting $N_1$ to 9,536 or 9,540, respectively.

As TABLE IV further illustrates, the multiplier $N_3$ is fixed at a value of 10. Thus, signal S3005 is a fixed frequency of 250 Hz. And therefore, selectable frequency $f_{s2}$ becomes 86,932 (as required to receive lower sideband signals) when multipler $N_5$ equals 19,125. Similarly, frequency $f_{s2}$ equals 86,409 or 202,218 when multiplier $N_5$ equals 19,010 or 19,413, respectively.

Selectable frequency $f_{s3}$ is generated by appropriately choosing $N_6$. As illustrated in TABLE IV, frequency $f_{s3}$ is suitable for demodulating lower sideband channels when $N_6$ equals 235, and is suitable for demodulating upper sideband channels when multiplier $N_6$ equals 207.

As the preceding description pointed out, sideband signals may lie anywhere within their assigned 5-kHz channel, and thus it is desirable to control the selectable frequency $f_{s2}$ in fine increments. TABLE IV implies how this fine incremental control is obtained. Signal S3005 has a fixed frequency of 250 hertz and multiplier $N_4$ is fixed at 55. This produces a frequency of 250 Hz/55 or approximately 5 Hz. Thus, by constructing multiplier $N_5$ as a programmable multiplier, frequency $f_{s2}$ is controllable in increments of approximately 5 Hz.

Figure 5:
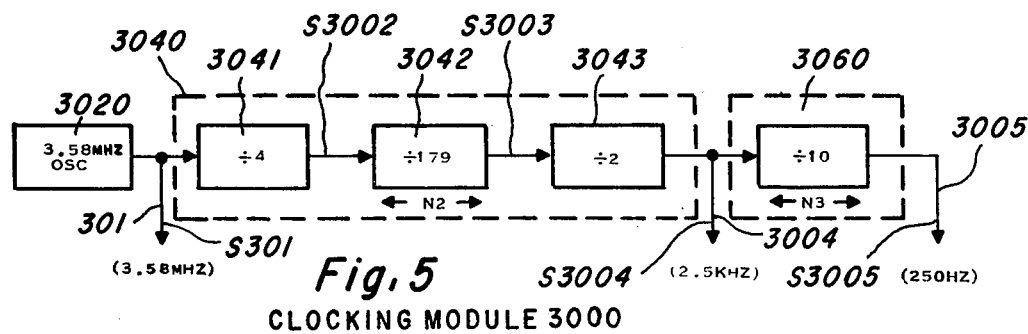
FIG. 5 is detailed circuit diagram of a clocking module 3000 included within FIG. 2.

Referring to FIG. 5, the details of clocking module 3000 are therein illustrated. Clocking module 3000 is comprised of a 3.58 mHz oscillator 3,020, a divide by $N_2$ logic circuit 3040 and divide by 10 logic circuit 3060. This configuration is illustrated in block diagram form in FIG. 5a.

As illustrated in FIG. 6A, clocking module 3100 is implemented by means of a phase lock loop. The phase lock loop is comprised of a phase detector 3120, a voltge controlled oscillator (VCO) 3140, and a programmable counter 3160. Phase detector 3120 has a first input coupled to lead 3004 and a second input coupled to an output of programmable counter 3160 via a lead 3161. A lead 3121 couples an output of phase detector 3120 to an input of VCO 3140. Lead 202 couples an output of VCO 3140 to an input of counter 3160 thereby completing the phase locked loop. Phase detector 3120 is illustrated in detail in FIG. 6B. It includes a logic gate 3122 having an input coupled to lead 3004 and an output coupled to an RC ramp generating circuit 3123. An operational amplifier 3124 is provided to buffer the output of the ramp generating circuit 3123. A logically-controlled switch 3125 has a signal input which couples to an output of operational amplifier 3124, and a logical control input which couples to a lead 3161. An output of switch 3125 couples to a holding capacitor 3126, and to the input of an operational amplifier 3127. Lead 3121 couples to an output of operational amplifier 3127. In this configuration, signal S3004 causes a ramp signal to be generated at the output of operational amplifier 3124, and switch 3125 samples the ramp signal in response to signal S3161. The sample is stored in holding capacitor 3126 and buffered by operational amplifier 3127. Thus, signal S3121 has a magnitude which reflects the phase difference between signals S3004 and S3161.

FIG. 6C is a detailed circuit diagram of VCO 3140. As therein illustrated, the VCO is comprised basically of a dual gate MOS-FET 3141 having one gate coupled to a biasing network 3142, and having a second gate coupled to a tuned circuit 3143. The tuned circuit includes a vari-cap 3144 which has a capacitance proportional to the voltage applied across its terminals. Thus, the resonant frequency of the circuit 3143 is dependent upon the voltage applied across vari-cap 3144. Signal S3121 is coupled to the vari-cap, and therefore, the oscillating frequency of circuit 3143 is responsive to the magnitude of that signal. The source of FET 3141 is coupled to a buffering transistor 3145. Lead 202 couples to the collector of transistor 3145, and signals S202, having the first selectable frequency, are generated thereon.

Counter 3160 is comprised of a fixed divide-by-four counter 3162, and programmable 12-bit counter 3163. Lead 202 couples to the input of divide-by-four counter, and a lead 3164 couples the divide-by-four counter output to the programmable 12-bit counter input. FIG. 6D is a detailed logic diagram of the 12-bit counter 3163. It is basically constructed of three 4-bit counters 3165-3167. Each of these counters is identical in construction to the previously-described counters 3044 and 3045. Counters 3165-3167 are serially coupled together to form one 12-bit counter. Programmable logic signals A0-A5 are supplied to the least significant six inputs of counter 3163 via lead 3401. Inputs to the most significant six bits of counter 3163 are fixed at either a 1 or a 0 logic level. Utilizing this configuration, counter 3163 has a programmable count defined in binary as 100100XXXXXX. The complement of this count is loaded into counter 3163 when its carryout is true. Logic gates 3168 are coupled to provide the necessary control signals on the LD inputs of counters 3165-3167.

FIG. 6E is a detailed circuit diagram, of an alternative embodiment of phase detector 3120. The phase detector has a reference clock input lead 3004, a sampling clock input lead 3161, and a phase detection output lead 3121. Reference clock signals S3004 are received on input lead 3004, and sampling clock signals S3161 are received on input lead 3161. In response thereto, phase detection signals S3121 are generated on lead 3121. The phase detection signals are analog signals having a magnitude which reflect the difference in phase between the reference clock and sampling clock signal. More specifically, signal S3121 has a quiescent value when the signals S3004 and S3161 are exactly in phase. On the other hand, signal S3121 has a value larger than the quiescent value when signal S3161 lags in phase from signal S3004. Similarly, signal S3121 has a magnitude smaller than the quiescent value when signal S3161 leads in phase with respect to signal S3004.

The phase detector of FIG. 6E is comprised basically of a variable-period sawtooth generator 3130 and a sample-and-hold circuit 3131. Variable-period sawtooth generator 3130 receives the reference clock signals on lead 3004, and in response thereto, generates sawtooth-shaped signals $st_1(t)$ and $st_2(t)$ having the same period as the reference signals. Signal $st_1(t)$ is generated on a node 3132, and is buffered to node 3133 as signal $st_2(t)$. Sample-and-hold circuit 3131 receives signal $st_2(t)$ on lead 3134 and, simultaneously, receives signal S3161 on lead 3161. Signal S3161 has a "sampling state" corresponding to the high voltage level, and a "non-sampling state" corresponding to a low voltage level. When signal S3161 is in the sampling state, sample-and-hold circuit 3131 samples sawtooth signal $st_2(t)$ and generates phase detection signal S3121 on lead 3121 with a magnitude proportional to the magnitude of the sample. Conversely, when signal S3161 is in the non-sampling state, sample-and-hold circuit 3131 does not sample signal $st_2(t)$, but simply holds the preceeding sample, and continues to generate signal S3121 with a magnitude proportional to the last sample taken.

Basically, variable-period sawtooth generator 3130 consists of an RC timing network 3135 coupled to a buffer circuit 3136. R-C timing circuit 3135 consists of a MOS load transistor 3135a coupled in series with a capacitor 3135b. This series connection forms node 3132. The gate of transistor 3135a couples to its drain. Thus, transistor 3135a operates in the depletion mode to provide a high-resistance path through which capacitor 3135b is charged. A MOS switching transistor 3135c is coupled in parallel with capacitor 3135b. The gate of transistor 3135c couples to lead 3004. Thus, transistor 3135c is selectively turned on or off by reference clock signal S3004.

Buffer circuit 3136 is comprised of a MOS load transistor 3136a coupled in series with a source transistor 3136b. This series connection forms node 3133. The gate of transistor 3136b couples to its source; and the gte of transistor 3136a couples by a lead to node 3132. Lead 3134 couples to the serial connection between transistor 3136a and 3136b, and signal $s_2(t)$ is generated thereon.

Sample-and-hold circuit 3131 is composed of a load transistor 3131a serially connected to a source transistor 3131b. The gate of load transistor 3131a couples to its drain. Thus, load transistor 3131a operates in the depletion load to provide a high-resistance path to transistor 3131b. Lead 13 couples to the serial connection between transistors 3131a and 3131b, and signal S3121 is generated thereon. The gate of transistor 3131b couples to the source of a transistor 3131c. Lead 3134 couples to the drain of transistor 3131c, and lead 3161 carrying signal 53161 couples to the drain of transistor 3131c.

The operation of the structure of FIG. 6E is illustrated by the voltage-timing diagrams of FIG. 6F. In particular, FIG. 6E1 illustrates signal S3004. During a time interval $\Delta t_1$, signal S3004 is at a high voltage state, and transistor 3135c turns on in response thereto. In this time interval, transistor 3135c provides a low impedance path across capacitor 3135b. Consequently, capacitor 3135b quickly discharges to ground forcing signal $S_1(t)$ to near zero voltage, as illustrated in FIG. 6F2.

Conversely, during a time interval $\Delta t_2$, signal S3004 is in a low voltage state. Transistor 3135c turns off in response to this low voltage, and consequently, capacitor 3135b charges in a ramp-type manner through transistor 3135a. Due to this charging action, the voltage across capacitor 3135b continues to rise until reference clock signal S3004 is switched to the high voltage state or until the voltage on node 3132 reaches Vdd. When the former occurs, capacitor 3135b will again discharge. The time intervals $\Delta t_1$ and $\Delta t_2$ are alternately repeated; and thus, signals $s_1(t)$ and signal $s_2(t)$ have a sawtooth-shaped waveform, as illustrated in FIG. 6F2.

The operation of sample-and-hold circuit 3131 is also illustrated in FIG. 6F. In particular, FIG. 6F3 illustrates signal S3161 which has a high voltage state and a low voltage state. Transistor 3131c, of the sample-and-hold circuit, turns off in response to signal S3161 being in a low-voltage state, and turns on in response to signal S3161 being in a high-voltage state. Thus, a high voltage signal 3161 transfers the voltage on lead 3134 to the gate of transistor 3131b. Conversely, a low voltage signal S3161 isolates the gate of transistor 3131b from lead 3134. Since no discharge path is provided for the gate of transistor 3131b, the voltage there remains held in the Miller capacitance 3131d of transistor 3131b until the next sample is taken.

The above-described sample-and-hold operation is illustrated in FIGS. 6F3 and 6F4. As therein illustrated, at a time $t_1$, signal S3161 goes high for a short period of time; and in response thereto, circuit 3131 samples the voltage on lead 3134. The value of this sample, designated S3121($t_1$) is held in capacitor 3131d and reflected on output lead 3121 until the next sample is taken. The sample at time $t_1$ is illustrated in FIG. 6F4 as having occurred in the center of the charging period $\Delta t_2$. The fact that this sample occurs late in the $\Delta t_2$ period is refected by the amplitude of the sample taken and the signal 53121($t_2$). In particular, the amplitude of this second sample will be greater than the amplitude of the preceeding sample; and the difference is proportional to the amount of phase difference between signals S3004 and S3161 at time $t_2$.

FIG. 6F also illustrates a sample taken at time $t_3$ which occurs earlier than midway through the sampling period $\Delta t_2$. THe sawtooth-shaped signal $s_2(t)$ has a relatively small amplitude when this sample is taken. Thus, the output signal S3121($t_3$) has a smaller amplitude than the signal S3121($t_1$). And this difference is proportional to the phase difference between signals S3004 and S3161 at time $t_3$.

Note that the clocking means herein described utilizes only a single reference frequency (signal crystal oscillator) from which all of the mixing frequencies and modulating frequencies are derived. This clocking means may also be utilized in transceivers which perform the sideband filtering with crystal filters. Such a crystal filter is described, for example, in the *Radio Amateur's Handbook* on pages 414–419, published by the American Radio Relay Leaque in 1976. The crystal filter therein described would replace charge coupled device filter 700, and the frequency shifting performed by filter 700 would be performed by altering frequencies $f_{s1}$, $f_{s3}$, or by adding an additional mixer.

A block diagram of clocking module 3200 is illustrated in FIG. 7A. As therein illustrated, the N5 factor is implemented by means of a phase lock loop. This loop is similar in structure to the phase lock loop which was utilized to implement the N1 factor as described in FIG. 6. The phase lock loop in FIG. 7 is comprised of a phase detector 3220, a VCO 3230, and a 16-bit programmable counter 3240. Phase detector 3220 has a first signal input coupled to lead 3005 for receiving signals having reference frequency of 250 Hz, and a second input coupled to lead 3241 for receiving signals generated by counter 3240. The output of phase detector 3220 is coupled via a lead 3221 to an input of VCO 3230. A lead 3231 couples an output of VCO 3230 to an input of counter 3240, thereby completing the loop.

FIG. 7B is a logic diagram illustrating the details of the 16-bit programmable counter 3240. Basically, it is comprised of four, 4-bit up counters 3150–3253, which are identical in construction to the previously-described 4-bit up counters, 3044 and 3045. Counters 3250–3253 are serially coupled together to form one 16-bit counter. The least significant nine input bits of counter 3240 receive programmable logic signals A8-A15 via leads 3402. The most significant seven input bits of counter are coupled to a fixed 1 or 0 logic level. The carryout of counter 3253 is coupled via logic gates 3254 to provide the necessary control signals to the LD inputs of counters 3250-3253.

Lead 3231 also couples to a divide by N4 counter 3260. A detailed logic circuit diagram of counter 3260 is illustrated in FIG. 7C. Counter 3260 selectively divides by 55 or 24 dependent upon the state of logic signal A7 which it receives via one of the leads 3402. When signal A7 is a high voltage level, the ones complement of 24 is applied to the inputs of counter 3260; and when signal A7 is a low voltage level, the ones complement of 55 is applied to the inputs of the counter. Two 4-bit counters, 3265 and 3266, having a construction identical to counters 3044 and 3045 are utilized to implement counter 3260. Logic gates 3267 provide the means for generating control signals on the LD inputs 3265 and 3266.

Figure 8:
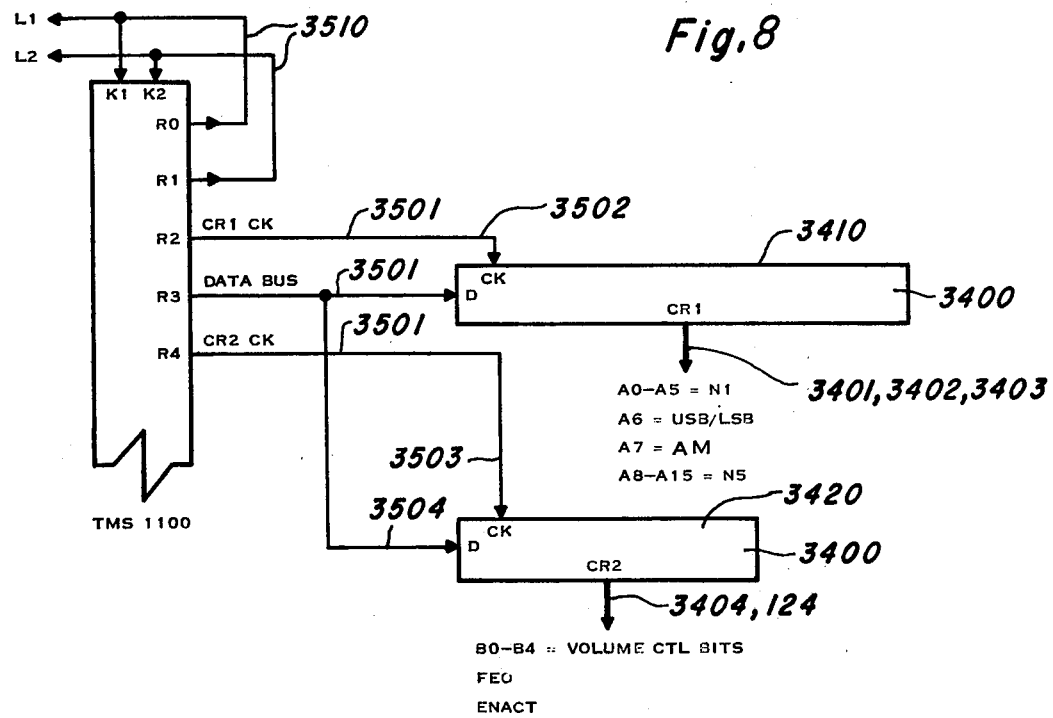
FIG. 8 is a circuit diagram illustrating the source of logic signals which are utilized by clocking modules 3000-3200.

Referring now to FIG. 8, the source of the logic signals which are generated to specify the value of multipliers N1, N4, N5, and N6, and to operate volume control unit 1000 is therein illustrated. The source of these logic signals includes two logic registers 3400. One of the registers 3410 is a 16-bit register, and it has outputs coupled to leads 3401, 3402, and 3403. Output bits 0-6 of register 3410 are coupled to lead 3401 and signals A0-A6 are generated thereon. Output bits 7-15 of register 3410 are coupled to leads 3402 and signals A7-A15 are generated thereon. Output 3410 is coupled to lead 3403 to generate signal A6.

The second register 3420 is a seven-bit register. It has output bits 0-4 coupled to leads 3404 to thereby provide the volume control logic signals B0-B4. Bit 5 of register 3240 is coupled to lead 124 to provide previously described logic signal FE0. Bit 6 of register 3240 provides a logic signal ENACT (enable auto call transmit) the function of which is described later in conjunction with transmit.

Registers 3410 and 3420 are comprised of D-type flip flops. A microprocessor 3500 is utilized to provide data and clocking input signals for both of these registers over leads 3501. This data constitutes microcommands which are interpreted and responded to by circuits coupled to the register outputs. In one embodiment, microprocessor 3500 is comprised of a TMS1100 which is manufactured by Texas Instruments Incorporated. Details of the TMS1100 are given in the publication entitled, "Programmers Reference Manual for the TMS 1000 Series MOS/LSI One-Chip Microcomputers." The publication is published and made available through Texas Instruments Incorporated. See also U.S. Pat. No. 3,991,305, by inventors Caudel et al assigned to Texas Instruments Incorporated.

The TMS1100 includes an 11-bit output register having bits labeled R0-R10. As illustrated in FIG. 8, bit R2 is coupled to the clocking input of register 3410 via a lead 3502, and a clocking signal CR1CK is generated thereon. Similarly, bit R4 is coupled to the clocking input of register 3420 via a lead 3503, and a clocking signal CR2CK is generated thereon. Bit R3 is coupled to the data inputs of registers 3410 and 3420 via lead 3504, and a data signal called DATABUS is generated thereon.

The TMS1100 also includes a 4 bit input register having inputs K1, K2, K4, and K8. Inputs K1 and K2 are coupled to control unit 40 via leads 3510 to provide a means by which microprocessor 3500 receives control signals L1 and L2 from the control unit. In response to signals L1 and L2, microprocessor 3500 generates the logic signals CR1CK, CR2CK, and DATABUS to thereby specify the appropriate multipliers N1–N6 and the appropriate volume control bits. Signals L1 and L2 are described infra.

Several modifications to the above-described receive circuitry of the transceiver of FIG. 2 may be made without departing from the inventive concepts disclosed therein. For example, a microprocessor other than the TMS1100 may be utilized to receive control signals via leads 3510 and in response thereto to generate data and clocking signals for registers 3400. A TMS1000 or a TMS1200 may be utilized to replace the TMS1100 as an example. In addition, the counters comprising clocking modules 3000-3200 may be implemented with circuits other than those illustrated in FIGS. 5-8. For example, the programmable counters may be implemented with down-counters rather than up-counters, in which case the actual number to be counted, rather than its complement, would be applied to the data inputs of the counter. Further, CCD filter 700 may be constructed to have passbands centered about the frequencies $nf_{s2} \pm kf_{s2}$ where k is not equal to $\frac{1}{4}$. For example, k could equal 1/8, in which case the values of N1-N6 would be scaled appropriately.

Figure 9:
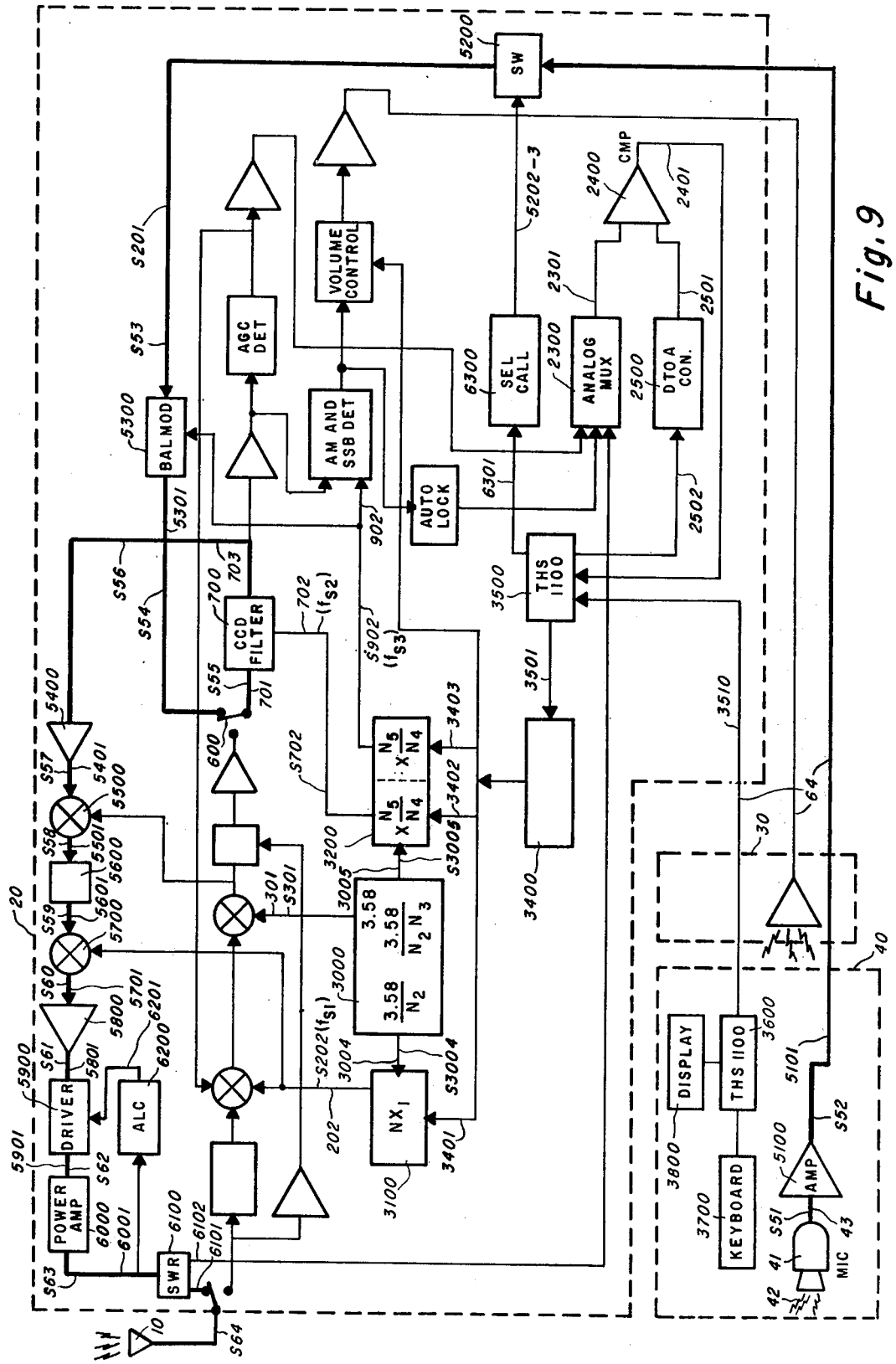
FIG. 9 is a circuit diagram identical to FIG. 2 with the exception that the transmit signal path components are emphasized rather than the receive signal path components.

The operation of the transceiver of FIG. 1, while it is in the transmit mode, will now be described in conjunction with FIGS. 9 and 10. FIG. 9 is identical to the previously described FIG. 2, except that FIG. 9 contains reference numerals identifying those components of the transceiver which are utilized in a transmit mode, whereas FIG. 2 contains reference numerals identifying those components used in the receive mode. Also, in FIG. 9, the transmit signal path is emphasized by a thickened line, whereas in FIG. 2, the receive signal path is emphasized by a thickened line. Signals S51-S64 are generated at various points on the transmit signal path as shown in FIG. 10.

Microphone 41 is the first component included within the transmit signal path. Microphone 41 receives sound waves 42, and in response thereto, generates electronic signals S51 shown in FIG. 10A on a lead 43. Lead 43 couples to the input of an audio amplifier 5100. Amplifier 5100 has an output coupled via a lead 5101 to a switch 5200, and signals S52 are generated thereon by amplifier 5100.

When speech is being transmitted, switch 5200 passes signals S52 to its output. Signals S53 at the output of switch 5200 are coupled via lead 5201 to the signal input of a balanced modulator 5300. Modulator 5300 also has a clocking input which is coupled to lead 902 for receiving signals S902 (which contain the third selectable frequency $f_{s3}$). Modulator 5300 has an output coupled via a lead 5301 to switch 600, and signals S54 are generated thereon. Signals S54 are double sideband signals in the sideband mode of operation, and are amplitude modulated signals in the AM mode of operation. That is, the carrier frequency, which equals multiples of the third selectable frequency $f_{s3}$, is inserted into signal S54 only in the AM mode of operation by modulator 5300.

Modulator 5300 generates signals S54 by sampling signals S53 at a frequency $f_{s3}$ of approximately 22 kHz. FIGS. 10B and 10C illustrate the effect of this sampling operation on two different frequency scales. As therein illustrated, signal S54 is comprised of a plurality of identical frequency spectrums, each of which is centered about a multiple of frequency $f_{s3}$. The center of the 21st frequency spectrum lies at 455 kHz. Thus, the lower sideband portion of the 21st spectrum is centered at approximately 450 kHz, and the upper sideband portion of the 21st spectrum is centered at approximately 460 kHz.

In the transmit mode, filter 700 is coupled to receive signal S54 through switch 600. The function of filter 700 is to selectively filter either the lower sideband, the upper sideband, or the AM signal which lies nearest to 455 kHz. Thus, dependent upon the mode of operation, the clocking frequency $f_{s2}$ of filter 700 is selectively chosen as designated in TABLE V such that the desired filtering is performed. FIG. 10D illustrates the passbands of filter 700 when it is clocked to pass only the lower sideband. As was the case for the previously-described read mode of operation, the 11th passband of filter 700 is used to filter sidebands from an input signal; whereas, the fifth passband of filter 700 is used to filter an AM band from an input signal.

The output of filter 700 generates signals S56. Signals 56 are coupled via a lead 703 to a tuned amplifier 5400. Amplifier 5400 is tuned to 455 kHz. Amplifier 5400 has an output lead 5401 and signals S57 are generated thereon. FIGS. 10E and 10F illustrate signals S56 and S57 in the frequency domain. As therein illustrated, signal S56 includes a plurality of filtered frequency bands; whereas, signal S57 includes only that band which is nearest to 455 kHz.

TABLE V

| $f_{s2}$ | MODE |
|---|---|
| 86,409 Hz | USB |
| 86,932 Hz | LSB |
| 202,218 Hz | AM |

Lead 5401 couples to the input of a mixer 5500. Mixer 5500 has a clocking input which is coupled to a lead 301 for receiving signals S301 thereon. Signal S301 includes a fixed 3.58-mHz frequency, and it is generated as described supra. Mixer 5500 has an output coupled to a lead 5501, and signals S58 are generated thereon. Signals S58 equal signals S57 frequency shifted to 3.58 mHz ±455 kHz.

Lead 5501 couples to the input of the filter 5600. Filter 5600 is tuned to only pass frequencies near 3.125 mHz. The output of filter 5600 is coupled to a lead 5601, and signals S59 are generated thereon. FIG. 10I illustrates signals S59 in the frequency domain.

Lead 5601 couples to the input of a mixer 5700. Mixer 5700 has a clocking input which couples to lead 202 for receiving signals S202. Signals S202 are generated as previously described, and contain the first selectable frequency $f_{s1}$. Frequency $f_{s1}$ is selectively chosen such that the sum of $f_{s1} +3.125$ mHz equals the center frequency of the channel on which signals S51 are to be broadcast. Mixer 5700 has an output coupled to a lead 5701, and signals S60 are generated thereon. Signals S60 equal signals S59 frequency shifted to $f_{s1} \pm 3.125$ mHz as indicated in FIG. 14J.

An amplifier 5800 is coupled to receive signal S60, and to tune out the lower band of frequencies. FIG. 10K illustrates the frequency spectrum of signal S61.

Signal S61 is serially coupled to the antenna 10 through a driver circuit 5900, a power amplifier 6000, and a standing wave ratio measuring circuit 6100. Signals S62, S63, and S64 are generated by these circuits, respectively. Driver 5900 and power amplifier 6000 modify the amplitude of signal S61, but not the frequencies contained therein. Thus, signal S64, which is transmitted by antenna 10, has the same frequency spectrum as signals S61, as illustrated in FIG. 10K.

The details of circuit components 5100-6200 are illustrated in FIGS. 15A - 15L. Referring first to FIG. 15A, a circuit diagram of audio amplifier 5100 is therein illustrated. Amplifier 5100 is comprised of an operational amplifier 5110 having a 1K input resistor 5111 and a 22K feedback resistor 5112 to thereby provide an amplifier having a gain of approximately 22. A resistive voltage divider 5113 provides a bias voltage to a second input of amplifier 5110. The output of amplifier 5110 couples to lead 5101 and generates signals S52 thereon.

FIG. 15B is a functional schematic of switch 5200. Switch 5200 has three signal inputs coupled to leads 5101, 5202 and 5203 for receiving signals S52, $f_0$, and $f_1$, respectively. A logic enabling network 5220 is provided for receiving signals A6 and R2. Signals A6 and R2 logically pass one of the three input signals through switch 5200. FIG. 15B includes a truth table indicating this logical operation.

A detail circuit diagram of balanced modulator 5300 is illustrated in FIG. 15C. Basically, modulator 5300 is comprised of a sampling circuit 5310, and a carrier inserting circuit 5340. Sampling circuit 5310 includes an operational amplifier 5311 having a negative input coupled to receive signals S53 through a 100K resistor, and a positive input coupled to receive signals S53 through a 10K resistor. A logically controlled switch 5312 is provided to couple the positive input of amplifier 5311 to ground in response to signal S902. Thus, amplifier 5311 samples signals S53 at the frequency $f_{s3}$. A feedback circuit 5313 is provided for amplifier 5311 which includes a capacitor 5314 for smoothing the sharp voltage transitions which are generated at the output of the amplifier 5311 due to the sampling operation.

The output of amplifier 5311 is coupled via a lead 5315 to the input of carrier inserting circuit 5340. Carrier inserting circuit 5340 includes an operational amplifier 5341 and a logically controlled switch 5342. Logic signal AM controls the operation of switch 5342. When signal AM is true, switch 5342 passes signal S902 to an input of operational amplifier 5341. Conversely, when signal AM is false, signal S902 is inhibited from passing to the input of amplifier 5341. A resistive network 5343 couples the sampled S53 signal from lead 5315 to the input of operational amplifier 5341. Amplifier 5341 adds the sampled S53 signal with the output of switch 5342. Signal S54 on lead 5301 equals this sum.

Signals S54 couples to an input of switch 600 which, in turn, couples to CCD filter 700. Switch 600 is illustrated in the previously-described FIG. 4G; and filter 700 is illustrated in the previously-described FIG. 4H. The output of CCD filter 700 couples to amplifier 5400 which is illustrated in FIG. 15D. As therein illustrated, amplifier 5400 includes a dual-gate MOSFET 5410. One of the gates is coupled to receive signal S56, while the other gate is grounded. Amplifier 5400 further includes a tank circuit 5420, having a resonant frequency of 455 kHz. The output of tank circuit 5420 couples via lead 5401 to the source of FET 5410 where the signals S57 are generated.

Signal S57 couples to mixer 5500 as illustrated in FIG. 15E. Mixer 5500 is constructed similar to mixer 300 which is illustrated in the previously-described FIG. 4C. Mixer 5500 includes a dual-gate FET 5510. One of the gates is coupled to receive signal S57 through a filter 5520 which has a resonant frequency of 455KHz. The other gate of FET 5510 couples to lead 301 for receiving the 3.58 MHz frequency. Mixer 5500 further includes a tank circuit 5530 having a resonant frequency of 3.125 MHz. The output of tank circuit 5530 couples via lead 5501 to the source of FET 5510 where signal S58 is generated.

FIG. 15F is a detailed circuit diagram 5600 of filter 5600. Filter 5600 receives signal S58 and in response thereto generates signal S59 on lead 5601. Basically, filter 5600 is comprised of a tank circuit 5610 having a resonant frequency of 3.125 MHz.

A detailed circuit diagram of mixer 5700 is provided by FIG. 15G. Mixer 5700 is similar in construction to the previously described mixer 200 of FIG. 4B. Mixer 5700 includes a dual-gate FET 5720. One of the gates is coupled to receive signal S59, and the other gate is coupled to receive signal S202 containing the first selectable frequency $f_{s1}$. A tank circuit 5630 having a resonant frequency of approximately 27 MHz has an output coupled to the source of FET 5720. Signals S60 are generated at the source of FET 5720.

FIG. 15H is a detailed circuit diagram of amplifier 5800. Amplifier 5800 is comprised of a dual-gate FET 5820. One of the gates is coupled to receive signal S60, while the other gate is coupled to a bias voltage. Amplifier 5800 further includes a tank circuit 5830 which has a resonant frequency of approximately 27 mHz. The output of tank circuit 5830 couples to the source of FET 5820 where signal S61 is generated.

The details of driver 5900 are illustrated in FIG. 15I. Driver 5900 includes a transistor amplifier 5920. Amplifier 5920 is basically comprised of a transistor 5921 having a tank circuit 5922 coupled to its collector. Tank circuit 5922 has a resonant frequency of approximately 27 MHz. Tank circuit 5922 includes a transformer 5923 having an output lead 5902 on which signals S62 are generated.

Driver 5900 further includes a second tank circuit 5930 which also has a resonant frequency of approximately 27 MHz. Signal S61 is coupled via the lead 5801 to the input of tank circuit 5930. The output of tank circuit 5930 is transformer coupled to the base of transistor 5921. The base of transistor 5921 is further coupled to receive a gain control signal ALC through a 2-K resistor 5931. The source of signal ALC is described below in conjunction with FIG. 15L.

A detailed circuit diagram of power amplifier 6000 is illustrated in FIG. 15J. Power amplifier 6000 receives signal S62 on lead 5902 and response thereto generates signal S63 on lead 6001. Basically, power amplifier 6000 is comprised of a common emitter amplifier 6010 having an output which is transformer coupled to a push-pull amplifier 6020. Push-pull amplifier 6020 includes a first common emitter amplifier 6021 and a second common emitter amplifier 6022. Amplifiers 6021 and 6022 alternately conduct in response to the output of amplifier 6010 being positive or negative, respectively. Push-pull amplifier 6020 further includes a transformer 6023 having an output coil coupled to lead 6001.

Signal S63 is inductively coupled via lead 6001 to the standing wave ratio measuring circuit 6100, as illustrated in FIG. 15K. Standing wave ratio circuit 6100 is comprised of a forward wave-measuring circuit 6120 and a reverse wave-measuring circuit 6140. Circuit 6120 includes an inductor 6121 which is serially coupled to a capacitor 6122 through a diode 6123. Signal S63 induces voltages across inductor 6121. Diode 6123 enables the induced voltage to generate a current through capacitor 6122 only when the inducted voltage is in response to a forward wave on lead 6001. Circuit 6120 further includes an operational amplifier 6124 having an input coupled to receive the voltage across capacitor 6122. Input and feedback resistors 6125 are provided to give operational amplifier 6124 a gain of approximately 10. The output of operational amplifier 6124 couples to a lead 6003, and signals VSWRF are generated thereon.

Circuit 6140 has a structure similar to that of circuit 6120. Circuit 6140 includes an inductor 6141, serially coupled to a capacitor 6142 through a diode 6143. A voltage is induced across inductor 6141 by signals S63, and diode 6143 permits current to flow through capacitor 6142 in response to the induced voltage whenever the induced voltage is due to a reflected wave within signal S63. An operational amplifier 6144 amplifies the voltage across capacitor 6142 by a factor of approximately 10 and generates output signals VSWRR on a lead 6004.

Signals VSWRF and VSWRR are coupled via leads 6003 and 6004 to analog multiplexer 2300, as was previously described in conjunction with FIG. 11C. Microprocessor 3500 selectively measures the voltage of signals VSWRF and VSWRR by means of digital-to-analog converter 2500 and comparator 2400. Under normal operational conditions, signal VSWRF is much larger than signal VSWRR. Conversely, under abnormal conditions, signal VSWRR approaches or exceeds the magnitude of signal VSWRF. An abnormal condition may be the result of a damaged antenna 10, as an example. In the transmit mode, microprocessor 3500 intermittently transmits a 1667-Hz signal for short time intervals via a selective call unit 6300 (described infra) and measures the ratio of signals VSWRF and VSWRR by utilizing the above-described circuits. Microprocessor 3500 then indicates a failure condition to the operator if the standing wave ratio exceeds 4.0.

FIG. 15L is a detailed circuit diagram of ALC circuit 6200. Circuit 6200 includes an averaging/peak detecting circuit 6210. Circuit 6210 has an input coupled to receive signal S63 on lead 6001. Lead 6001 is coupled to a diode 6211 through a 15K resistor 6212. The input of diode 6211 is coupled to ground through a 15K resistor 6213, and the output of diode 6211 is coupled to ground through a 220K resistor 6214. Thus, a voltage is generated across resistor 6214 which is proportional to a rectified signal S3. The output of diode 6211 is further coupled to ground through a capacitor 6215 and a resistor 6216. An inverting logic gate 6217 has an input coupled to receive logic signal AM and an output coupled to the node between capacitor 6215 and resistor 6216. Thus, resistor 6216 is logically switched in and out of circuit 6210 in response to logic signal AM. As a result, the voltage across resistor 6214 equals the average value of signal S63 when signal AM is at a high logic level, and equals the peak value of signal S63 when signal AM is at a low logic level.

ALC circuit 6200 further includes an ALC voltage generating circuit 6240 having an input coupled to receive the voltage across resistor 6214 via a lead 6202. Circuit 6240 includes a constant current generator 6241 having an input coupled to lead 6202, and having an output coupled to a capacitor 6242. Current source 6241 operates to charge capacitor 6242 to a predetermined voltage level at a rapid rate when power is initially turned on. A voltage amplifier 6243 has a positive input coupled to capacitor 6242 and a negative input coupled to a reference voltage VR. The output of amplifier 6243 generates signal ALC on lead 6201, which couples to driver amplifier 5900 as was described in conjunction with FIG. 15I. A second circuit 6244 is provided to rapidly charge and slowly discharge capacitor 6242 when signals S3 actually contain modulation signals.

The transceiver of FIG. 13 further includes means for performing a selective call operation. To perform a selective call operation, a receiving transceiver is assigned a call number. The call number consists of a sequence of five digits. Subsequently, a transmitting transceiver transmits the call number; and in response thereto, the receiving transceiver senses the transmitted call number as being the one which it was assigned. In response to the sensing of its call number, the receiving transceiver performs a preprogrammed operation (e.g., the microprocessor in the receiving transceiver turns the volume on).

FIG. 16 is a logic diagram of a selective call unit 6300 which is included in the transceiver of FIG. 13. Call unit 6300 is comprised of two J-K flip-flops 6310 and a D flip-flop 6320. The J-K flip-flops are intercoupled to form a divide-by-three counter, while the D flip-flop is intercoupled to form a divide-by-two counter. A logic signal ENACT generated by a microprocessor 3500 is coupled via a lead 6301 to enable counters 6310 and 6320; and a clocking signal having a fixed frequency of 5.0 kHz is coupled via a lead 6302 to clocking inputs of flip-flops 6310. In response thereto, a signal f1 of 1667 Hz and a signal f0 of 833 Hz are generated on leads 5202 and 5203 respectively. Leads 5202 and 5203 couple to the input of switch 5200 as was previously described in conjunction with FIG. 15B. The output of switch 5200 is logically controlled by a microprocessor 3500 via logic signals A6 and R2.

The above-described configuration provides a means for transmitting a binary coded selective call number. Each digit of the selective call number is represented by a sequence of four binary bits. A "0" bit is represented by 833 Hz, while a "1" is represented by 1667 Hz. The "1" and "0" frequency assignments may also be reversed as an alternative. Each bit comprising the call number is transmitted for one bit period. The bit period equals 32 ms in one embodiment. The actual transmission of a call number is manually activated via control unit 40, as is described infra.

The receiving transceiver utilizes the previously-described autolock logic 2600 for recognizing when its assigned unit number is transmitted. The receiving transceiver first monitors the SAGC signal to determine the presence of signal. Then it enables its autologic. Once enabled, the AL signal reflects a count of either 833 Hz or 1667 Hz for each bit that is transmitted. Microprocessor 3500, in the receiving transceiver, reads signal AL and compares the bit sequence to its assigned unit number. When the received call number and the assigned call number are equal, the receiving transceiver is activated.

Selective call unit 6300 is also utilized in the sideband transmit mode to transmit an intermittent carrier for the receiving transceiver to lock onto. (The operation of the receiving transceiver was described in conjunction with FIGS. 12A and 12B.) In one embodiment, microprocessor 3500, in the transmitting transceiver, logically controls switch 5200 such that selective call unit 6300 transmits the 1667-Hz frequency for 300 ms at the beginning of each transmission. The receiving transceiver detects the presence of the transmitted frequency by monitoring SAGC, and by enabling autolock unit 2600 when SAGC exceeds the squelch level.

The apparatus described above for performing a digital selective call is also capable of assigning different call numbers to several channels. That is, keyboard 3700 in control head 40 is utilized to send a plurality of call numbers and associated channels to processor 3500. Processor 3500 stores the call numbers in its memory; and selectively reads the call numbers for comparison with a transmitted call number dependent upon which channel it was being operated on at a particular time period.

Additionally, the apparatus described above may be utilized to transmit digital selective call numbers plus subsequent digital control messages. The digital messages are specified by the operator utilizing keyboard 3700 in a manner similar to that used to select a particular call number. The digital control message is received by processor 3500 via leads 3510. In response thereto, processor 3500 sends microcommands to switch 5200 to thereby couple the 1 and 0 frequencies to the antenna in a manner which indicates the bits of the digital control message. The receiving transceiver utilizes the autolock logic 2600 for receiving the digital control message in the same manner that it is utilized to receive a selective call number. Processor 3500 of the receiving unit interprets the digital control message and generates microcommands in response thereto for implementing the digitally-coded function. For example, such digital control messages could be utilized to remotely control stereos, televisions, or home lighting.

The means for manually operating the transceiver of FIG. 13 (and the transceiver of FIG. 2) will now be described in conjunction with FIG. 17. FIG. 17 is a detailed schematic diagram of keyboard 3700, display 3800, and microprocessor 3600, all of which are included within control head 40. In general, each operation which the transceiver performs is initiated via keyboard 3700.

Keyboard 3700 includes a plurality of control keys 3710 and a plurality of digit keys 3740. Control keys 3710 include a C ↑ key and a C ↓ key for incrementing the channel up or down respectively. Also, an S ↑ key and an S ↓ key is provided for modifying the squelch setting upward or downward respectively. Similarly, a V ↑ key and a V ↓ key is provided for turning the volume up or down, respectively. And a Δ ↑ key and a Δ ↓ key are provided for moving the clarifying frequency (i.e., $f_{s2}$) up or down respectively while receiving sideband signals.

Keyboard 3700 further includes keys LB, UB, and AM for selecting lower sideband, upper sideband or AM mode of operation, respectively. Also a CC key is provided for enabling the clear channel function, while a BC key is provided for enabling the busy channel function. A # key is provided for assigning a call number to the transceiver, and for enabling the transceiver to transmit a call number. A SWR key is provided for reading out the standing wave ratio. An O/F key is provided for enabling or disenabling the transceiver. And a PTT key (push to talk) is provided for enabling the transmit mode of operation.

Additionally, digit keys 3740 are provided for use in conjunction with various of the above-described control keys. For example, digit keys 2740 are used in conjunction with the LB key, UB key, and AM key for selecting a channel and mode of operation simultaneously. The actual sequence in which keys 3740 and keys 3710 are used to activate the various functions is listed in TABLE VI which will be described shortly.

Keyboard 3700 couples via leads 3701 and 3702 to microprocessor 3600 and is sensed thereby. Leads 3701 couple to the K register inputs of processor 2600, whereas leads 3702 couple to the R register outputs of microprocessor 3600. Thus, the state of any key within keyboard 3700 is sensed by microprocessor 3600 by selectively setting bits in register R, and by sensing for a return signal in register K.

Display 3800 also couples to microprocessor 3600 and is controlled thereby. Display 3800 is comprised of a 5-digit LED display 3820 and a digit driver circuit 3810. Leads 3801 couple the output of driver circuit 3810 to the digit inputs of display 3820; while leads 3802 couple the input to driver circuit 3810 to the output of register R of microprocessor 3600. The output of register O of microprocessor 3600 is coupled via leads 3803 to the segment inputs of LED display 3820. Thus, the state of the 5-digit display 3820 is controlled by microprocessor 3600 via its registers R and O.

Microprocessor 3600 is further coupled via lead 3510 to microprocessor 3500. Leads 3510 provide the means whereby messages are sent between microprocessors 3500 and 3600. The manner in which these messages are transmitted is illustrated in FIG. 18. FIG. 18A is a timing diagram illustrating a message being sent from microprocessor 3600 to microprocessor 3500. As the timing diagram indicates, microprocessor 3600 is a master unit, whereas microprocessor 3500 is a slave unit. That is, all the messages are initiated by processor 3600, and only answer-back messages are given by processor 3500.

At a time T1, signals L1 and L2 are both low. This is the quiescent state of L1 and L2. At a second time instant T2 the master processor raises signal L1 to a high voltage level. In response thereto, at a time T3, the slave processor raises signal L2 to a high voltage level. The high voltage level on signal L2 indicates to the master processor that the slave is ready to receive a transmitted message.

In order for the master to transmit one bit, the following sequence occurs. At a time T4, the master forces the voltage of L2 to a low value. Subsequently, the master forces the voltage of L1 to equal the voltage of the transmitted bit. Next, the master forces the voltage of signal L2 to a high state. Then, after a period of approximately 5 msec, the master forces the voltage of signal L2 to a low state. At a time T5 while signal L2 is in a low state, the master then changes the voltage of signal L1 to equal that of the next bit to be transmitted. Signals L1 and L2 are sequenced in a T4-T5 manner for each bit that is transmitted.

FIG. 18B is a timing diagram illustrating how messages are sent from the slave to the master processor. At a time T10, after the master has sent its message, the voltage of signals L1 and L2 are in the quiescent state. At a time T11, the slave sets the voltage of signal L1 to equal the bit which it desires to transmit. Subsequently, the slave sets signal L2 to a high voltage level. The high voltage level is maintained on signal L2 for approximately 5 msec. Subsequently, signal L2 is set by the slave to a low voltage level. And then, at a time T12, the slave changes the voltage level on signal L1 to equal the next bit to be transmitted. The T10-T12 sequence of signals on L1 and L2 is repeated by the slave for each bit which the slave transmits.

All messages which are transmitted by the master or by the slave processor on leads 3510 have a format as indicated in FIG. 18C. As therein indicated, each message consists of an ID digit, followed by message digits M1-M5, followed by a check digit C. Each of the digits is comprised of four bits. The ID digit indicates the general nature of the message. The message digits indicate the specific details of the message. And the check digit is generated as a function of the ID digit and the M1-M5 digits. For example, in one embodiment, it equals the sum of the "1" bits in the ID digit and M1-M5 digits.

Table VI lists several functions which the transceivers of FIGS. 2 and 14 perform, and indicates which keys of keyboard 3700 and which messages between the master and slave are utilized to implement each function. For example, the first entry in TABLE VI indicates how to select a particular channel and mode. First, two of the digit keys are depressed to indicate the desired channel. Next, either an AM key, an LB key, or a UB key is depressed dependent upon the desired mode of operation. Microprocessor 3600 responds to the above key sequence by sending a message to the slave processor 3500 as indicated in TABLE VI. That is, the master sends an ID digit of D, an M1 and M2 digit indicating a channel number, the M3 digit indicating the mode of operation, and M4 and M5 digits which are "don't care's". A check digit C is also sent. In response thereto, microprocessor 3500 sends an ID digit of C, an M1 and M2 digit indicating the channel number requested, an M3 digit indicating the requested mode of operation, an M4 digit indicating the signal strength on the requested channel, and an M5 digit indicating status of the analog signal processor. The check digit C is also sent. The slave processor 3500 also performs the requested operations by utilizing the clocking means 3000, 3100, 3200, and the other logically-controllable means as was previously described.

TABLE VI

SELECT CHANNEL & MODE

KEY SEQ. = Most Sig. CH. Number, Least Sig.
  CH. Number, mode Key (e.g., AM/LB/UB)

TABLE VI-continued

| | | | | | | | |
|---|---|---|---|---|---|---|---|
| L1, L2 MESSAGE SEQUENCE: | | | | | | | |
| 1-MASTER = D | channel number | channel number | Mode | Φ | Φ | | C |
| 2-SLAVE = C | channel number | channel number | Mode | signal strength | status | | C |

VOLUME CHANGE
  KEY SEQ. = V↓ or V↑
  L1, L2 MESSAGE SEQUENCE:

| | | | | | | |
|---|---|---|---|---|---|---|
| 1-MASTER = A | Φ | Φ | Φ | Φ | Φ | C |
| 2-SLAVE = A | volume | squelch | clarify | clarify | Φ | C |
| 3-MASTER = B | volume +1 | squelch | clarify | clarify | Φ | C |
| 4-SLAVE = A | volume +1 | squelch | clarify | clarify | Φ | C |

SQUELCH CHANGE
  KEY SEQ. = S↓ or S↑
  L1, L2 MESSAGE SEQUENCE:
    Same as for volume change, except the squelch
    digit is updated instead of the volume digit.

CLARIFY CHANGE
  KEY SEQ. = Δ↓ or Δ↑
  L1, L2 MESSAGE SEQUENCE:
    Same as for volume change, except the clarify
    digits are updated instead of the volume digit.

CHANNEL CHANGE
  KEY SEQ. = C↓ or C↑
  L1, L2 MESSAGE SEQUENCE:

| | | | | | | |
|---|---|---|---|---|---|---|
| 1-MASTER = C | Φ | Φ | Φ | Φ | | C |
| 2-SLAVE = C | channel number | channel number | Mode | signal strength | status | C |
| 3-MASTER = D | channel number +1 | Mode | | Φ | Φ | C |
| 4-SLAVE = C | channel number +1 | Mode | | signal strength | status | C |

Repeat messages 3 and 4 until key is released.

CLEAR CHANNEL
  KEY SEQ. = CC↓ or CC↑
  L1, L2 MESSAGE SEQUENCE:
    Same as for channel change, except the master
    checks each message 4 for the presence of a
    clear channel, and stops the 3-4 sequence when
    a clear channel is found.

BUSY CHANNEL
  KEY SEQ. = BC
  L1, L2 MESSAGES:
    Same as for clear channel, except master
    checks message 4 for a busy channel.

SENSE STANDING WAVE RATIO
  KEY SEQ. = SWR
  L1, L2 MESSAGES:

| | | | | | | |
|---|---|---|---|---|---|---|
| 1-MASTER = E | C | Φ | Φ | Φ | Φ | C |
| 2-SLAVE = F | VSWR | VSWR | Φ | Φ | Φ | C |
| 3-MASTER = C | Φ | Φ | Φ | Φ | Φ | C |
| 4-SLAVE = C | channel number | channel number | Mode | signal strength | status | C |

Steps 3 and 4 occur when key is released.

ASSIGN A SEL. CALL NUMBER TO TRANSCEIVER
  KEY SEQ. = N1, N2, N3, N4, N5, # where N1-N5
        is the selective call number; then
        depress key "0".
  L1, L2 MESSAGE SEQUENCE:

| | | | | | | |
|---|---|---|---|---|---|---|
| 1-MASTER = 0 | N1 | N2 | N3 | N4 | N5 | C |
| 2-SLAVE = C | channel number | channel number | Mode | signal strength | status | C |
| 3-MASTER = E | 2 | Φ | Φ | Φ | Φ | C |
| 4-SLAVE = C | channel number | channel number | Mode | signal strength | status | C |

TRANSMIT A SEL. CALL NUMBER
  KEY SEQ. = N1, N2, N3, N4, N5, # where N1-N5 is the
        call number to be transmitted; then depress
        Key "1".
  L1, L2 MESSAGE SEQUENCE:

| | | | | | | |
|---|---|---|---|---|---|---|
| 1-MASTER = 1 | N1 | N2 | N3 | N4 | N5 | C |
| 2-SLAVE = C | | | | | | C |
| 3-MASTER = E | 4 | Φ | Φ | Φ | Φ | C |
| 4-SLAVE = C | | | | | | C |

The digits N1-N5 are transmitted subsequently,
  when the push to talk key "PTT" is depressed.

PUSH TO TALK
  KEY SEQ. = DEPRESS PTT
  L1, L2 MESSAGE SEQUENCE (W/o SEL. CALL)

| | | | | | | |
|---|---|---|---|---|---|---|
| 1-MASTER = E | 8 | Φ | Φ | Φ | Φ | C |
| 2-SLAVE = C | channel number | channel number | Mode | signal strength | status | C |

L1, L2 MESSAGE SEQUENCE (W. SEL. CALL)

| | | | | | | |
|---|---|---|---|---|---|---|
| 1-MASTER = E | A | Φ | Φ | Φ | Φ | C |
| 2-SLAVE = | | SAME AS ABOVE | | | | |

L1, L2 MESSAGE SEQUENCE (W. SEL. CALL & DIGITAL CALL
      MESSAGE)

| | | | | | | |
|---|---|---|---|---|---|---|
| 1-MASTER = E | A | Φ | Φ | Φ | Φ | C |

TABLE VI-continued

| | | | | | |
|---|---|---|---|---|---|
| C-SLAVE = | | | SAME AS ABOVE | | |
| KEY SEQ. = RELEASE PTT | | | | | |
| L1, L2 MESSAGE SEQUENCE | | | | | |
| 1-MASTER = E | 4 | Φ Φ Φ | Φ | C | |
| 2-SLAVE = | | | SAME AS ABOVE | | |

All of the previously described details may be interrelated by considering typical transceiver operations in conjunction with the transceiver block diagrams of FIGS. 2 and 13. Referring to FIG. 2, for example, suppose an operator wishes to operate on channel 1 in the lower sideband mode. Utilizing keyboard 3,700, the operator sequentially depresses digit keys 0 and 1, and control key LB. In response thereto, processor 3,600 senses the depressed keys, and sends messages via leads 3,510 to the slave processor 3,500. These messages were detailed in Table VI under the heading "Channel Select and Mode."

Slave processor 3,500 interprets the messages and in response thereto sends microcommands to registers 3,400 via leads 3,501. The microcommands indicate clocking frequencies $f_{S1}$, $F_{S2}$, $F_{S3}$, such that the lower sideband of channel 1 will pass through the received signal path. The previously described Table IV indicates the details of these microcommands. In particular, the microcommands will indicate an $N_1$ of 9,536; and $N_4$ of 55; an $N_5$ of 19,125; and an $N_6$ of 235. Recall that the values of N2 and N3 are fixed at 1,432 and 10, respectively. As a result of these microcommands, clocking module 3,100 generates clocking signal S202 of a frequency 23.84MHZ. Similarly, clocking module 3,200 generates clocking signal S702 with frequency 86,932 and also generates clocking signal S902 with a frequency of 20,345HZ.

Mixer 200 mixes signals S2 and frequency $F_{S1}$ to thereby generate signals S3 on lead 201. Frequency $S_{S1}$ was chosen such that channel 1 of signal S3 is centered at frequency 3.125 MHZ because mixer 200 includes a tank circuit having a resonant frequency of 3.125 MHZ. As such, signal S3 discriminates between the selected channel and the surrounding channels.

Mixer 300 mixes signal S3 with the fixed frequency of 3.58MHZ. The difference between 3.58MHZ and 3.125MHZ equals 455KHZ; and mixer 300 includes a tank circuit having a center frequency of 455KHZ. Thus, the output of mixer 300, which is signal S4, contains channel 1 at 455KHZ.

Signal S4 is coupled to CCD filter 700 through a switch 600. Switch 600 is controlled by microcommands from processor 3,500. The microcommands are generated in response to the manually activated PTT key on keyboard 3,700.

Filter 700 receives signals S5 and filters the lower sideband from the signal in response to frequency $f_{S2}$ of clocking signals S702. The previously described Table III lists the appropriate $f_{S2}$ frequency. Signal S8, which is the output of the filter, is the lower sideband of channel 1 as the operator selected.

Signal S8 passes through the modulator 900. The modulator 900 simultaneously receives clocking signals on leads 902 which contain the third selectable frequency $f_{S3}$. Demodulator 900 samples the selected sideband signals at frequency $f_{S3}$; and as a result, the selected sideband is frequency shifted to the audio range.

The demodulator output is coupled via lead 901 to volume control unit 1,000, which amplifies its input signals in response to microcommands. These microcommands are entered into register 3,400 by processor 3,500 in response to messages from processor 3,600 indicating that the operator depressed the V↑ or V↓ key. Audio amplifier 1,100 amplifies the output of the volume control unit, and the output of the amplifier is coupled to speaker 1,200.

When the operator wishes to transmit on his selected channel, he simply pushes the PTT key on keyboard 3,700. As a result, processor 3,600 sends a message to the slave processor 3,500 via leads 3,510, as indicated in Table VI. In response thereto, processor 3,500 generates microcommands which couple the input to filter 700 to the transmit path, and which couple the antenna to the transmit path.

Additionally, processor 3,500 generates microcommands which couple selective call unit 6,300 to the transmit path lead 5,201 via switch 5,200. These microcommands are generated in a sequence such that a frequency of 1,667HZ is first transmitted for a period of several milliseconds. During this time interval, microprocessor 3,500 monitors the magnitude of the forward travelling waves and the reverse travelling waves on antenna 10. This is accomplished by selecting the SWR output by microcommand via analog multiplexer 2,300, and by monitoring the magnitude of the selected signals via leads 2,401.

Note also that during this time period, the receiving transceiver will have its squelch broken, and thus will enable its autolock logic 2,600 via microcommand from processor 3,500. The receiving transceiver monitors the actual frequency transmitted by enabling autolock unit 2,600, by sending microcommands to multiplexer 2300 which select the autolock unit, and by reading signals on leads 2,401. The receiving transceiver then compares the actual frequency of the carrier with the nominal frequency, and makes adjustments to frequency $f_{S2}$ which compensate for any differences. In one embodiment, the receiving unit makes the adjustments by modifying multiplier N5 in clocking module 3,200.

Subsequently, the transmitting unit utilizes the selective call circuitry 6,300 to perform an autocall function (if the operator has so specified via keyboard 3,700). To this end, processor 3,500 generates microcommands which sequentially couple the 1 frequency and the 0 frequency of the selective call unit 6,300 to the transmit path via switch 5,200. Each bit comprising the selective call number is broadcast for only several milliseconds, and thus the entire operation is completed in a fraction of a second. Thus, the SWR monitoring function, the autolock function, and the selective call function are all easily performed between the time that the operator depresses a pushed PTT key and the time in which he begins to speak. After the last bit of the selective call message is transmitted, processor 3,500 generates the microcommand to switch 5,200 which couples signals S52 through the switch thereby enabling speech transmissions. Alternatively, if the operator has specified a digital control message for transmission, then processor 3500 will broadcast the bits of that message following transmission of the selective call number.

Various embodiment of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. A highly selective programmable filter module comprising:
   (a) a charge transfer device transversal filter means having a selectively controllable passbandwidth centered about a finely tuneable center frequency, said filter means being coupled to simultaneously receive: (1) filter input signals comprised of a plurality of frequency bands and (2) a filter clocking signal of selectable frequency $f_s$, said filter means being responsive to said filter clocking signal for controlling the passbandwidth and center frequency of said filter means in response to the frequency of said filter clocking signal;
   (b) clocking means comprised of:
      (i) a phase locked loop having an input for receiving a reference frequency $f_r$ and a feedback loop comprised of a first programmable counter means of programmable count $N_1$, and
      (ii) a second programmable counter of programmable count $N_2$ coupling said phase locked loop to said filter means, said clocking means generating clocking signals at said selectable frequency $f_s = f_r(N_1/N_2)$ where $N_1$ and $N_2$ are integers determined by programming signals applied to said first and second programmable counters.

2. The filter module according to claim 1 wherein said phase locked loop is comprised of sampling means for sampling the magnitude of a sawtooth signal of frequency $f_r$ at a controllable sampling rate, a VCO coupled to said sampling means for generating a clock signal at a frequency determined by the sampled magnitude, said first programmable counter coupling said VCO to said sampling means for controlling said sampling rate.

3. A highly selective programmable filter module comprised of phase locked loop means and filter means, said filter means having clocking inputs coupled to receive clocking signals of a selective frequency $f_s$ for generating passbands centered at frequencies $N \times f_s \pm Kf_0$ where N is an integer, said phase locked loop means having an input for receiving reference clock signals of frequency $f_r$ and having an output coupled to said clocking inputs of said bandpass filter means for generating thereon said clocking signals of frequencies $(N_1/N_2) \times f_r$ where $N_1$ and $N_2$ are integers, said phase locked loop means being comprised of:
   (a) voltage controlled oscillator means having an input coupled to receive phase detection signals for generating VCO output signals of a frequency proportional to the magnitude of said phase detection signals;
   (b) first counter means having an input coupled to receive said VCO output signals for generating feedback signals of said VCO output signal frequency divided by $N_1$;
   (c) phase detection means having inputs coupled to simultaneously receive said reference clock signals and said feedback signals for generating said phase detection signals in response thereto of a magnitude indicating phase difference between said reference clock signals and said feedback signals, said phase detector being comprised of:
      (i) sawtooth generator means having inputs coupled to receive said reference clock signals for generating sawtooth-shaped signals of the same period as said reference clock signals, and
      (ii) sample-and-hold means having inputs coupled to simultaneously receive said sawtooth-shaped signals in response to one state of said feedback signals, for holding the most current one of said samples, and for generating said phase detection samples of a magnitude proportional to the magnitude of said held sample; and
   (d) second counter means having an input coupled to receive said VCO output signals for generating filter clocking signals of said VCO output signal frequency divided by $N_2$.

4. A highly selective programmable filter module according to claim 3, wherein said filter means is a charge transfer device transversal filter.

5. A highly selective programmable filter module according to claim 3 wherein said sawtooth generator means is comprised of a resistive means serially coupled to a capacitive means with a switching means coupled in parallel with said capacitive means, said switching means having an input coupled to receive said digital reference clock signals for selectively providing high and low impedance paths in parallel with said capacitive means in response to the voltage levels of said reference clock signals.

6. A highly selective programmable filter module according to claim 3 wherein said sample and hold means is comprised of a first MOS transistor having a source coupled to receive said sawtooth shaped signals and a gate coupled to receive said feedback signals; a MOS load transistor serially coupled to a MOS source transistor, said source transistor having a gate coupled to a drain of said first MOS transistor, and said source transistor having a Miller capacitance for holding said samples.

7. A highly selective programmable filter module according to claim 3 wherein said sample and hold means is comprised of a logically controlled electronic analog switch having an output node coupled to a holding capacitor, a signal input node coupled to receive said sawtooth-shaped signals, and a logic control input coupled to receive said feedback signals.

8. A highly selective programmable filter module comprised of phase locked loop means and filter means, said filter means having clocking inputs coupled to receive clocking signals of a selective frequency $f_s$ for generating passbands centered at frequencies $N \times f_s \pm Kf_0$ where N is an integer, said phase locked loop means having an input for receiving reference clock signals of frequency $f_r$ and having an output coupled to said clocking inputs of said bandpass filter means for generating thereon said clocking signals of frequencies $(N_1/N_2) \times f_r$ where $N_1$ and $N_2$ are integers, said phase locked loop means being comprised of:
   (a) voltage controlled oscillator means having an input coupled to receive phase detection signals for generating VCO output signals of a frequency proportional to the magnitude of said phase detection signals;
   (b) first counter means having an input coupled to receive said VCO output signals for generating feedback signals of said VCO output signals frequency divided by $N_1$;

(c) phase detection means having inputs coupled to simultaneously receive said reference clock signals and said feedback signals for generating said phase detection signals in response thereto of a magnitude indicating phase difference between said reference clock signals and said feedback signals; and (d) second counter means having an input coupled to receive said VCO output signals for generating filter clocking signals of said VCO output signal frequency divided by $N_2$, wherein said first and second counter means have data inputs coupled to receive logic signals identifying said $N_1$ and $N_2$ integers, respectively, for dividing said VCO output signals in response thereto.

* * * * *